(12) United States Patent
Lee

(10) Patent No.: US 8,758,512 B2
(45) Date of Patent: Jun. 24, 2014

(54) VAPOR DEPOSITION REACTOR AND METHOD FOR FORMING THIN FILM

(75) Inventor: Sang In Lee, Sunnyvale, CA (US)

(73) Assignee: Veeco ALD Inc., Fremont, CA (US)

( * ) Notice: Subject to any disclaimer, the term of this patent is extended or adjusted under 35 U.S.C. 154(b) by 277 days.

(21) Appl. No.: 12/794,209

(22) Filed: Jun. 4, 2010

(65) Prior Publication Data

US 2010/0310771 A1    Dec. 9, 2010

Related U.S. Application Data

(60) Provisional application No. 61/185,076, filed on Jun. 8, 2009.

(51) Int. Cl.
*C23C 16/00* (2006.01)

(52) U.S. Cl.
USPC ......... 118/715; 118/718; 118/50; 156/345.33

(58) Field of Classification Search
USPC ..................... 118/715, 718, 50; 156/345.33
See application file for complete search history.

(56) References Cited

U.S. PATENT DOCUMENTS

| | | |
|---|---|---|
| 3,896,244 A | 7/1975 | Ellis et al. |
| 4,293,326 A | 10/1981 | Terneu et al. |
| 4,834,020 A | 5/1989 | Bartholomew et al. |
| 4,891,247 A | 1/1990 | Shamshoian |
| 5,063,951 A | 11/1991 | Bard et al. |
| 5,120,568 A | 6/1992 | Schuurmans et al. |
| 5,122,391 A | 6/1992 | Mayer |
| 5,136,975 A | 8/1992 | Bartholomew et al. |
| 5,275,668 A | 1/1994 | Dell et al. |
| 5,286,295 A * | 2/1994 | Sauvinet et al. ............... 118/718 |
| 5,300,189 A | 4/1994 | Kokaku et al. |
| 5,368,897 A | 11/1994 | Kurihara et al. |
| 5,482,557 A | 1/1996 | Kanai et al. |
| 5,549,780 A | 8/1996 | Koinuma et al. |
| 5,560,777 A | 10/1996 | Ahn |
| 5,565,249 A | 10/1996 | Kurihara et al. |

(Continued)

FOREIGN PATENT DOCUMENTS

| | | |
|---|---|---|
| CN | 1436602 A | 8/2003 |
| EP | 0188208 A2 | 7/1986 |

(Continued)

OTHER PUBLICATIONS

Dameron, A.A. et al., "Molecular Layer Deposition of Alucone Polymer Films Using Trimethylaluminum and Ethylene Glycol," Chem. Mater., 2008, pp. 3315-3326, vol. 20.

(Continued)

*Primary Examiner* — Jeffrie R Lund
*Assistant Examiner* — Yuechuan Yu
(74) *Attorney, Agent, or Firm* — Fenwick & West LLP

(57) ABSTRACT

A vapor deposition reactor and a method for forming a thin film. The vapor deposition reactor includes at least one first injection portion for injecting a reacting material to a recess in a first portion of the vapor deposition reactor. A second portion is connected to the first space and has a recess connected to the recess of the first portion. The recess of the second portion is maintained to have pressure lower than the pressure in the first space. A third portion is connected to the second space, and an exhaust portion is connected to the third space.

18 Claims, 40 Drawing Sheets

(56) References Cited

U.S. PATENT DOCUMENTS

| | | | |
|---|---|---|---|
| 5,578,130 A | 11/1996 | Hayashi et al. | |
| 5,665,640 A | 9/1997 | Foster et al. | |
| 5,683,516 A | 11/1997 | DeDontney et al. | |
| 5,711,814 A | 1/1998 | Mori | |
| 5,725,668 A | 3/1998 | Foster et al. | |
| 5,820,947 A | 10/1998 | Itoh | |
| 5,863,337 A | 1/1999 | Neuman et al. | |
| 5,879,459 A | 3/1999 | Gadgil et al. | |
| 5,935,647 A | 8/1999 | DeDontney et al. | |
| 5,951,771 A | 9/1999 | Raney et al. | |
| 6,022,414 A | 2/2000 | Miller et al. | |
| 6,051,150 A | 4/2000 | Miyakawa | |
| 6,079,353 A * | 6/2000 | Leksell et al. | 118/715 |
| 6,083,355 A | 7/2000 | Spence | |
| 6,099,974 A | 8/2000 | Lenling | |
| 6,143,077 A * | 11/2000 | Ikeda et al. | 118/715 |
| 6,195,504 B1 | 2/2001 | Horie et al. | |
| 6,200,389 B1 | 3/2001 | Miller et al. | |
| 6,206,972 B1 | 3/2001 | Dunham | |
| 6,319,615 B1 | 11/2001 | Jansen | |
| 6,354,109 B1 * | 3/2002 | Boire et al. | 65/60.1 |
| 6,406,590 B1 | 6/2002 | Ebata et al. | |
| 6,416,822 B1 | 7/2002 | Chiang et al. | |
| 6,424,091 B1 | 7/2002 | Sawada et al. | |
| 6,435,428 B2 | 8/2002 | Kim et al. | |
| 6,521,048 B2 | 2/2003 | Miller et al. | |
| 6,539,891 B1 | 4/2003 | Lee et al. | |
| 6,569,501 B2 | 5/2003 | Chiang et al. | |
| 6,634,314 B2 | 10/2003 | Hwang et al. | |
| 6,641,673 B2 | 11/2003 | Yang et al. | |
| 6,656,284 B1 | 12/2003 | Hwang et al. | |
| 6,656,831 B1 | 12/2003 | Lee et al. | |
| 6,730,614 B1 | 5/2004 | Lim et al. | |
| 6,812,157 B1 | 11/2004 | Gadgil | |
| 6,824,816 B2 | 11/2004 | Aaltonen et al. | |
| 6,890,386 B2 | 5/2005 | DeDontney et al. | |
| 6,926,572 B2 | 8/2005 | Park et al. | |
| 6,972,055 B2 | 12/2005 | Sferlazzo | |
| 6,997,371 B2 | 2/2006 | Shabtay | |
| 7,087,119 B2 | 8/2006 | Sandhu | |
| 7,118,779 B2 | 10/2006 | Verghese et al. | |
| 7,384,680 B2 | 6/2008 | Bi et al. | |
| 7,455,884 B2 | 11/2008 | Sandhu | |
| 7,494,545 B2 | 2/2009 | Lam et al. | |
| 7,615,486 B2 | 11/2009 | Yoon et al. | |
| 7,754,013 B2 | 7/2010 | Granneman | |
| 7,886,688 B2 | 2/2011 | Takeuchi et al. | |
| 7,914,847 B2 | 3/2011 | Verghese et al. | |
| 7,943,527 B2 | 5/2011 | Kumar et al. | |
| 7,981,472 B2 | 7/2011 | Dalton et al. | |
| 8,257,799 B2 | 9/2012 | Lee | |
| 8,328,982 B1 | 12/2012 | Babayan et al. | |
| 2001/0047759 A1 | 12/2001 | Matsui et al. | |
| 2002/0092616 A1 | 7/2002 | Kim | |
| 2002/0100418 A1 | 8/2002 | Sandhu et al. | |
| 2002/0112819 A1 | 8/2002 | Kamarehi et al. | |
| 2002/0197864 A1 | 12/2002 | Sneh | |
| 2003/0072881 A1 | 4/2003 | Yang et al. | |
| 2003/0143328 A1 | 7/2003 | Chen et al. | |
| 2003/0198587 A1 | 10/2003 | Kaloyeros et al. | |
| 2003/0214043 A1 | 11/2003 | Saitoh et al. | |
| 2004/0052972 A1 | 3/2004 | Schmitt | |
| 2004/0067641 A1 | 4/2004 | Yudovsky | |
| 2004/0083967 A1 | 5/2004 | Yuda et al. | |
| 2004/0129212 A1 | 7/2004 | Gadgil et al. | |
| 2004/0171280 A1 | 9/2004 | Conley et al. | |
| 2004/0224527 A1 | 11/2004 | Sarigiannis et al. | |
| 2004/0247787 A1 | 12/2004 | Mackie et al. | |
| 2004/0261946 A1 | 12/2004 | Endoh et al. | |
| 2004/0265195 A1 | 12/2004 | Lee | |
| 2005/0016457 A1 | 1/2005 | Kawasaki et al. | |
| 2005/0064207 A1 | 3/2005 | Senzaki et al. | |
| 2005/0064236 A1 | 3/2005 | Lim et al. | |
| 2005/0084610 A1 | 4/2005 | Selitser et al. | |
| 2005/0092247 A1 | 5/2005 | Schmidt et al. | |
| 2005/0106094 A1 | 5/2005 | Kondo | |
| 2005/0183768 A1 | 8/2005 | Roscheisen et al. | |
| 2006/0019033 A1 | 1/2006 | Muthukrishnan et al. | |
| 2006/0068519 A1 | 3/2006 | Dunbar et al. | |
| 2006/0183301 A1 | 8/2006 | Yeom et al. | |
| 2006/0211243 A1 | 9/2006 | Ishizaka et al. | |
| 2006/0213441 A1 | 9/2006 | Kobrin et al. | |
| 2006/0237399 A1 | 10/2006 | Horner-Richardson et al. | |
| 2006/0240665 A1 | 10/2006 | Kang et al. | |
| 2007/0082500 A1 | 4/2007 | Norman et al. | |
| 2007/0095286 A1 | 5/2007 | Baek et al. | |
| 2007/0145023 A1 | 6/2007 | Holber et al. | |
| 2007/0224348 A1 | 9/2007 | Dickey et al. | |
| 2007/0237699 A1 | 10/2007 | Clark | |
| 2007/0243325 A1 | 10/2007 | Sneh | |
| 2007/0264488 A1 | 11/2007 | Lee | |
| 2007/0281082 A1 | 12/2007 | Mokhlesi et al. | |
| 2007/0281089 A1 | 12/2007 | Heller et al. | |
| 2008/0026162 A1 | 1/2008 | Dickey et al. | |
| 2008/0075881 A1 | 3/2008 | Won et al. | |
| 2008/0092953 A1 | 4/2008 | Lee | |
| 2008/0106202 A1 | 5/2008 | Du et al. | |
| 2008/0124945 A1 | 5/2008 | Miya et al. | |
| 2008/0241387 A1 | 10/2008 | Keto | |
| 2008/0260940 A1 | 10/2008 | Yoon et al. | |
| 2008/0260963 A1 | 10/2008 | Yoon et al. | |
| 2008/0260967 A1 | 10/2008 | Yoon et al. | |
| 2009/0017190 A1 | 1/2009 | Sferlazzo et al. | |
| 2009/0044661 A1 | 2/2009 | Li et al. | |
| 2009/0047775 A1 | 2/2009 | Yamazaki et al. | |
| 2009/0064932 A1 | 3/2009 | Kim et al. | |
| 2009/0068849 A1 | 3/2009 | Endo et al. | |
| 2009/0081885 A1 | 3/2009 | Levy et al. | |
| 2009/0098276 A1 | 4/2009 | Burrows et al. | |
| 2009/0102385 A1 | 4/2009 | Wi | |
| 2009/0130858 A1 | 5/2009 | Levy | |
| 2009/0133714 A1 | 5/2009 | Yamazaki et al. | |
| 2009/0165715 A1 * | 7/2009 | Oh | 118/723 R |
| 2009/0170345 A1 | 7/2009 | Akae et al. | |
| 2009/0197406 A1 | 8/2009 | Cao et al. | |
| 2009/0291211 A1 | 11/2009 | Ryu et al. | |
| 2009/0304924 A1 | 12/2009 | Gadgil | |
| 2009/0320749 A1 | 12/2009 | Yoon et al. | |
| 2010/0037820 A1 | 2/2010 | Lee | |
| 2010/0037824 A1 | 2/2010 | Lee | |
| 2010/0041213 A1 | 2/2010 | Lee | |
| 2010/0055347 A1 | 3/2010 | Kato et al. | |
| 2010/0064971 A1 | 3/2010 | Lee | |
| 2010/0068413 A1 | 3/2010 | Lee | |
| 2010/0124618 A1 | 5/2010 | Kobayashi et al. | |
| 2010/0132615 A1 | 6/2010 | Kato et al. | |
| 2010/0140802 A1 | 6/2010 | Matsumoto et al. | |
| 2010/0181566 A1 | 7/2010 | Lee | |
| 2010/0189900 A1 | 7/2010 | Dickey et al. | |
| 2010/0215871 A1 | 8/2010 | Lee | |
| 2010/0221426 A1 | 9/2010 | Sferlazzo | |
| 2010/0255625 A1 | 10/2010 | De Vries | |
| 2010/0304047 A1 | 12/2010 | Yang et al. | |
| 2011/0070380 A1 | 3/2011 | Shero et al. | |
| 2011/0076421 A1 | 3/2011 | Lee | |
| 2012/0021252 A1 | 1/2012 | Lee | |
| 2012/0027953 A1 | 2/2012 | Lee | |
| 2012/0094149 A1 | 4/2012 | Lee | |
| 2012/0114877 A1 | 5/2012 | Lee | |
| 2012/0125258 A1 | 5/2012 | Lee | |
| 2012/0196050 A1 | 8/2012 | Vermeer et al. | |
| 2012/0207926 A1 | 8/2012 | Lee | |
| 2012/0207948 A1 | 8/2012 | Lee | |
| 2012/0213945 A1 | 8/2012 | Lee | |
| 2012/0225204 A1 | 9/2012 | Yudovsky | |
| 2012/0225206 A1 | 9/2012 | Yudovsky | |
| 2012/0225207 A1 | 9/2012 | Yudovsky | |
| 2012/0301632 A1 | 11/2012 | Lee | |
| 2013/0260539 A1 | 10/2013 | Lee | |

FOREIGN PATENT DOCUMENTS

| | | |
|---|---|---|
| EP | 0499524 A1 | 2/1992 |
| EP | 2159304 A1 | 3/2010 |

(56) References Cited

FOREIGN PATENT DOCUMENTS

| | | |
|---|---|---|
| EP | 2360293 A1 | 8/2011 |
| FR | 2736632 A1 | 1/1997 |
| JP | S62-081018 A | 4/1987 |
| JP | H01-096924 A | 4/1989 |
| JP | 1-161835 A | 6/1989 |
| JP | H01-223724 A | 9/1989 |
| JP | H02-187018 A | 7/1990 |
| JP | H04-092414 A | 3/1992 |
| JP | H09-064000 A | 3/1997 |
| JP | 09-167757 A | 6/1997 |
| JP | 09-199738 A | 7/1997 |
| JP | 10-507994 | 8/1998 |
| JP | 11-092943 A | 4/1999 |
| JP | H11-285882 | 10/1999 |
| JP | 2001-357780 A | 12/2001 |
| JP | 2002-018276 A | 1/2002 |
| JP | 2002-339075 A | 11/2002 |
| JP | 2003-049272 A | 2/2003 |
| JP | 2003-073835 A | 3/2003 |
| JP | 2003-174019 A | 6/2003 |
| JP | 2003-324070 | 11/2003 |
| JP | 2004-010949 A | 1/2004 |
| JP | 2004/091837 A | 3/2004 |
| JP | 2005-089781 A | 4/2005 |
| JP | 2005-116898 | 4/2005 |
| JP | 2005-347245 A | 5/2005 |
| JP | 2006-236697 A | 9/2006 |
| JP | 2007-019460 A | 1/2007 |
| JP | 2007-191792 A | 8/2007 |
| JP | 2007-266093 A | 10/2007 |
| JP | 2007266093 A * | 10/2007 |
| JP | 2008-108895 A | 5/2008 |
| JP | 2008108895 A * | 5/2008 |
| JP | 2009-531535 A | 9/2009 |
| KR | 100175011 B1 | 11/1998 |
| KR | 10-2001-0040561 | 5/2001 |
| KR | 10-2002-0078804 | 10/2002 |
| KR | 10-2002-0083564 A | 11/2002 |
| KR | 10-2003-0086056 A | 11/2002 |
| KR | 10-0631972 | 8/2003 |
| KR | 10-2004-0016779 A | 2/2004 |
| KR | 10-2004-0042209 A | 5/2004 |
| KR | 10-2005-0015931 A | 2/2005 |
| KR | 10-0542736 | 1/2006 |
| KR | 10-631972 A | 8/2006 |
| KR | 10-0622609 B1 | 9/2006 |
| KR | 10-2006-104230 A | 10/2006 |
| KR | 10-2006-0117607 | 11/2006 |
| KR | 10-0760428 A | 11/2006 |
| KR | 10-0673211 B1 | 1/2007 |
| KR | 10-2007-0051332 A | 5/2007 |
| KR | 10-2007-0076955 A | 7/2007 |
| KR | 10-2007-0096770 A | 10/2007 |
| KR | 10-2007-0101127 A | 10/2007 |
| KR | 10-2007-0101360 A | 10/2007 |
| KR | 10-0771926 A | 10/2007 |
| KR | 10-0791677 B1 | 1/2008 |
| KR | 10-0840897 B1 | 6/2008 |
| KR | 10-2008-0067042 | 7/2008 |
| KR | 10-2008-0067042 A | 7/2008 |
| WO | WO 99/39144 A1 | 8/1999 |
| WO | WO 2006/054854 A1 | 5/2006 |
| WO | WO 2007/106076 A2 | 9/2007 |
| WO | WO 2007/134322 A2 | 11/2007 |
| WO | WO 2008/130369 A1 | 10/2008 |
| WO | WO 2009/031886 A2 | 3/2009 |
| WO | WO 2009/042147 A1 | 4/2009 |
| WO | WO 2010/138102 A1 | 12/2010 |
| WO | WO 2012/028776 A1 | 3/2012 |

OTHER PUBLICATIONS

PCT Invitation to Pay Additional Fees, PCT Application No. PCT/US12/25095, May 22, 2012, 2 pages.
PCT International Search Report and Written Opinion, PCT Application No. PCT/US12/25483, May 29, 2012, 10 pages.
U.S. Appl. No. 13/369,717, filed Feb. 9, 2012, Inventor: Sang In Lee.
U.S. Appl. No. 13/397,590, filed Feb. 15, 2012, Inventor: Sang In Lee.
PCT International Search Report and Written Opinion, PCT Application No. PCT/US11/45199, Dec. 6, 2011, 10 pages.
PCT International Search Report and Written Opinion, PCT Application No. PCT/US2011/056285, Mar. 8, 2012, 11 pages.
PCT International Search Report and Written Opinion, PCT Application No. PCT/US11/58552, Mar. 14, 2012, 12 pages.
PCT International Search Report and Written Opinion, PCT Application No. PCT/US2011/060474, Mar. 22, 2012, 12 pages.
U.S. Appl. No. 13/190,104, filed Jul. 25, 2011, Inventor: Sang In Lee.
PCT International Search Report, PCT Application No. PCT/US12/24451, May 21, 2012, 12 pages.
PCT Written Opinion, PCT Application No. PCT/KR2010/001076, Sep. 27, 2010, 8 pages.
PCT International Search Report and Written Opinion, PCT Application No. PCT/US2010/037660, Aug. 3, 2010, 9 pages.
PCT International Search Report and Written Opinion, PCT/US2010/050358, Dec. 1, 2010, 10 pages.
"Atomic Layer Deposition," Cambridge NanoTech Inc., 2005, 40 pages, [Online] Retrieved from the Internet<URL:http://www.pascaltechnologies.com/files%5CTech.Docs%5CAtomic%20Layer%20Deposition%20Tutorial.pdf>.
Puurunen, R.L. et al., "Surface Chemistry of Atomic Layer Deposition: A Case Study for the Trimethylaluminum/Water Process," Journal of Applied Physics, 2005, pp. 121301-1-121301-52, vol. 97.
European Extended Search Report, European Application No. 10786646.9, Nov. 29, 2012, 17 pages.
PCT International Search Report and Written Opinion, PCT Application No. PCT/US11/44470, Dec. 7, 2011, 13 pages.
PCT International Search Report and Written Opinion, PCT Application No. PCT/US12/25095, Aug. 3, 2012, 18 pages.
U.S. Appl. No. 13/185,793, filed Jul. 19, 2011, Inventor: Sang In Lee.
U.S. Appl. No. 13/273,076, filed Oct. 13, 2011, Inventor: Sang In Lee.
U.S. Appl. No. 13/285,417, filed Oct. 31, 2011, Inventor: Sang In Lee.
U.S. Appl. No. 13/295,012, filed Nov. 11, 2011, Inventor: Sang In Lee.
European Examination Report, European Application No. 10821080.8, Apr. 17, 2013, 11 pages.
Choi, J. M. et al., "Ultraviolet Enhanced Si-Photodetector Using p-NiO Films," Applied Surface Science, May 15, 2005, pp. 435-438, vol. 244, No. 1-4.
European Extended Search Report, European Application No. 10733634.9, Jan. 30, 2013, 5 pages.
Hermle, M. et al., "Analyzing the Effects of Front-Surface Fields on Back-Junction Silicon Solar Cells Using the Charge-Collection Probability and the Reciprocity Theorem," Journal of Applied Physics, Mar. 10, 2008, 7 pages, vol. 103, No. 5.
Kymakis, E. et al., "Bi-Layer Photovoltaic Devices with PPQ as the Electron Acceptor Layer," Solar Energy Materials & Solar Cells, Jul. 24, 2006, pp. 1705-1714, vol. 90, No. 12.
Verlinden, P. et al., "Measurement of Diffusion Length and Surface Recombination Velocity in Interdigitated Back Contact (IBC) and Front Surface Field (FSF) Solar Cells," Physica, 1985, pp. 317-321, vol. 129, No. 1-3.
Yoshikawa. O. et al., "Enhanced Efficiency and Stability in P3HT:PCBM Bulk Heterojunction Solar Cell by Using TiO2 Hole Blocking Layer," Mater. Res. Soc. Symp. Proc., Materials Research Society, Jan. 2007, 6 pages.
Chinese First Office Action, Chinese Application No. 201080025311.3, Jun. 25, 2013, 14 pages.
Japanese First Office Action, Japanese Application No. 2012-514229, Jul. 17, 2013, 8 pages.
Japanese Office Action, Japanese Application No. 2012-532219, Sep. 10, 2013, 7 pages.
U.S. Appl. No. 13/904,825, filed May 29, 2013, Inventor: Sang In Lee.

(56) References Cited

OTHER PUBLICATIONS

He, G. et al., "Metal-Organic Chemical Vapor Deposition of Aluminum Oxynitride from Propylamine-Dimethylaluminum Hydride and Oxygen: Growth Mode Dependence and Performance Optimization," Journal of Materials Chemistry, 2012, pp. 7468-7477, vol. 22.

Zhu, M. et al., "Aluminum Oxynitride Interfacial Passivation Layer for High-Permittivity Gate Dielectric Stack on Gallium Arsenide," Applied Physics Letters, 202903, 2006, pp. 1-3, vol. 89.

European Examination Report, European Patent Application No. 10786646.9, Oct. 24, 2013, 5 pages.

Maydannik, P.S. et al., "An Atomic Layer Deposition Process for Moving Flexible Substrates," Chemical Engineering Journal, 2011, pp. 345-349, vol. 171.

Taiwan Office Action, Taiwan Application No. 100126066, Oct. 8, 2013, 14 pages.

Japanese Office Action, Japanese Application No. 2012-514229, Nov. 12, 2013, 4 pages.

* cited by examiner

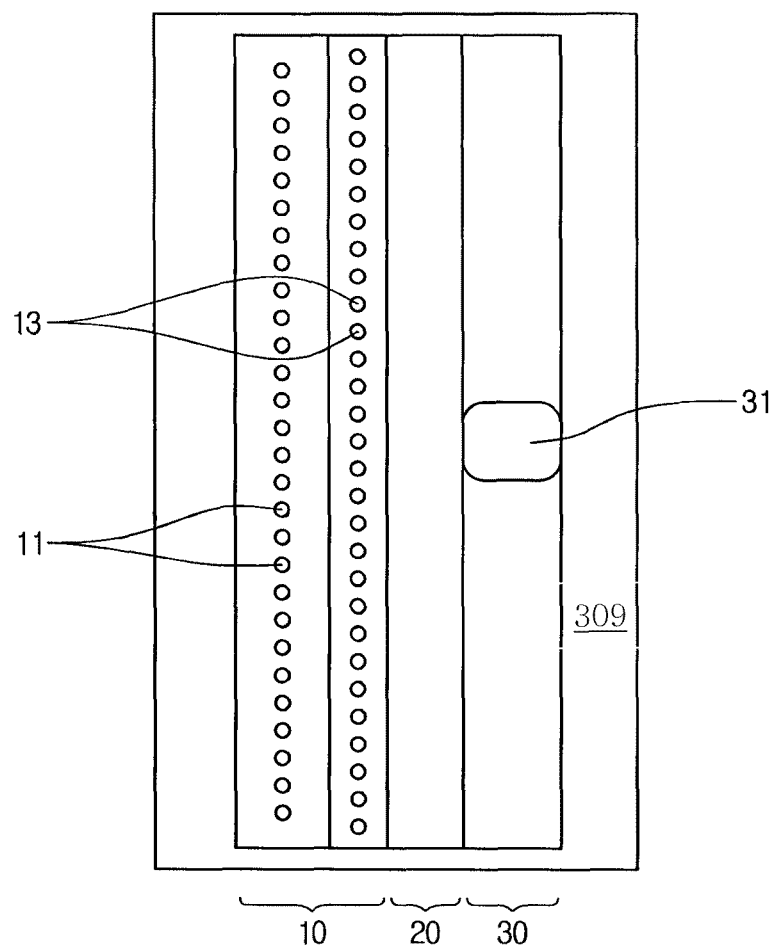

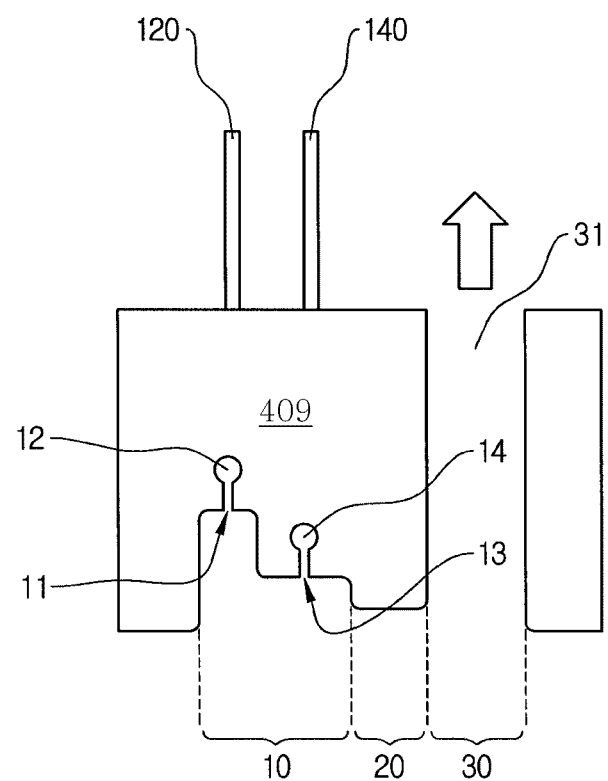

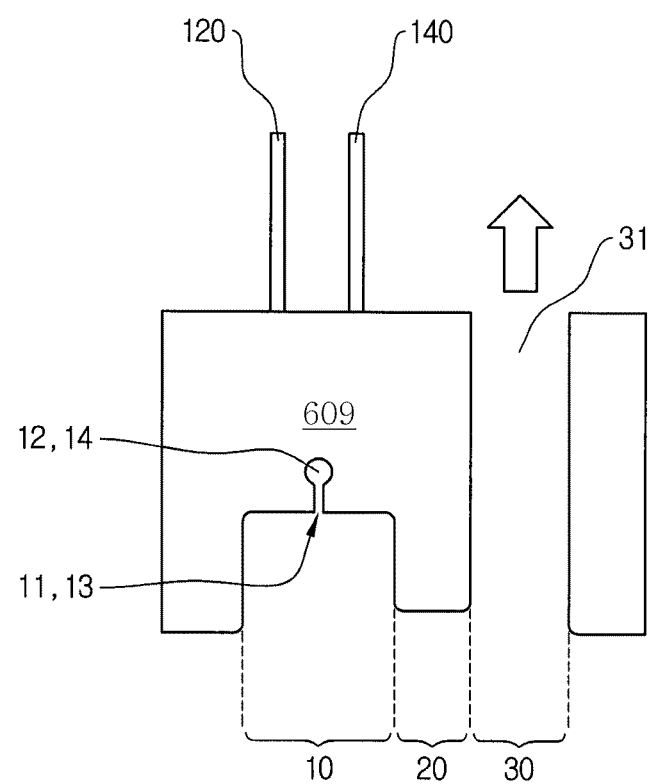

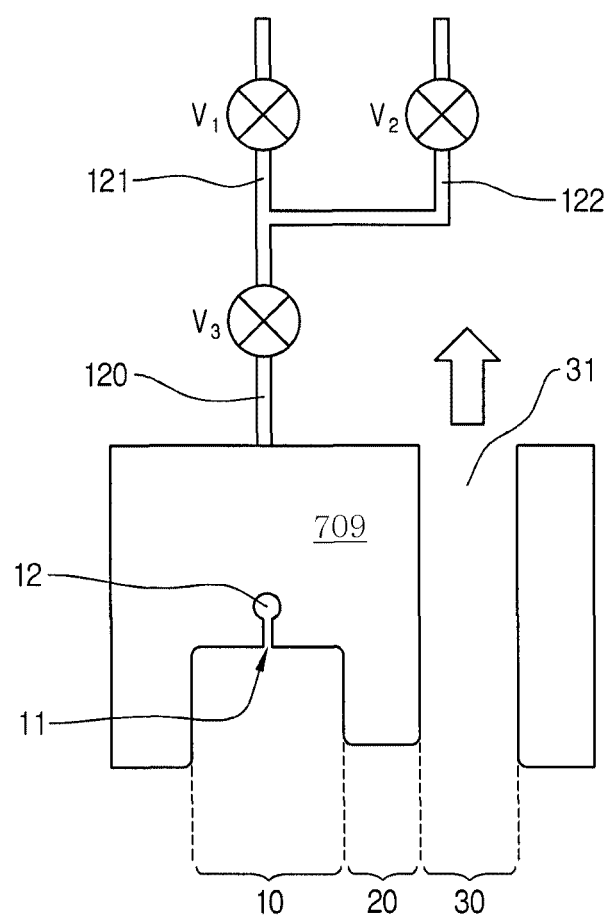

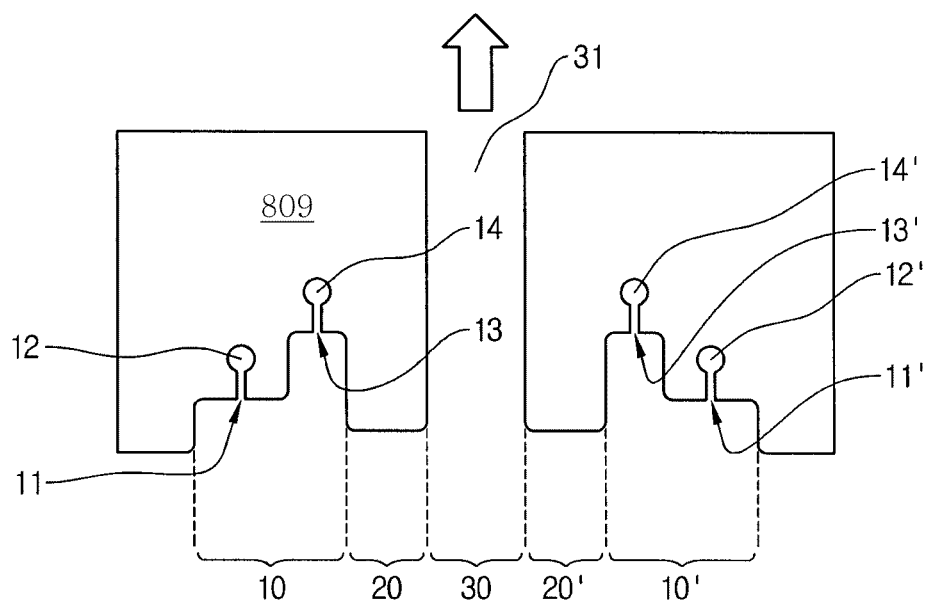

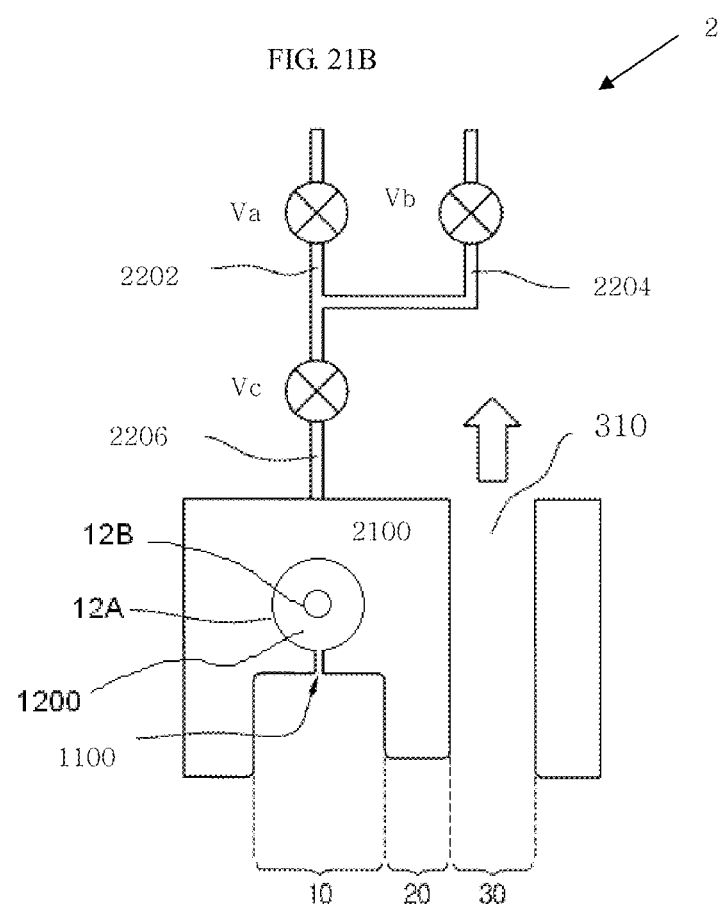

VAPOR DEPOSITION REACTOR AND METHOD FOR FORMING THIN FILM

CROSS-REFERENCE TO RELATED APPLICATION

This application claims priority from and the benefit under 35 U.S.C. §119(e) of U.S. Patent Application No. 61/185,076, entitled "Reactor Apparatus For Atomic Layer Deposition And Method Of Forming Thin Film Using The Reactor Apparatus," filed on Jun. 8, 2009, which is incorporated by reference herein in its entirety. This application is related to U.S. patent application Ser. No. 12/539,477, entitled "Vapor Deposition Reactor For Forming Thin Film," filed on Aug. 11, 2009; U.S. patent application Ser. No. 12/539,490, entitled "Vapor Deposition Reactor," filed on Aug. 11, 2009; and U.S. patent Ser. No. 12/560,690, entitled "Vapor Deposition Reactor Using Plasma And Method for Forming Thin Film Using the Same," filed on Sep. 16, 2009, which are incorporated by reference herein in their entirety.

BACKGROUND

1. Field of the Invention

The disclosure relates to a vapor deposition reactor and a method for forming a thin film using the same.

2. Description of the Related Art

In general, a showerhead-type reactor is used in chemical vapor deposition (CVD) for injecting a precursor. In the showerhead-type reactor deposition is performed by mixing a source precursor and a reactant precursor within the interior of a showerhead and then spraying the mixed precursors onto a substrate. On the other hand, in a reactor for atomic layer deposition (ALD), a source precursor and a reactant precursor are alternately sprayed so that they are not mixed with each other. Based on the direction of the precursor spray, reactors are divided into (i) a cross-flow or traveling-wave type reactor and (ii) a type of reactor that injects the precursor vertically to the surface of the substrate. The cross-flow or traveling-wave type reactor injects a precursor in a direction parallel to a surface of a substrate surface for deposition of the precursor.

The ALD uses the bonding force of a chemisorbed layer that is different from the bonding force of a physisorbed layer. In the ALD, a precursor is absorbed into the surface of a substrate and then purged with an inert gas. As a result, physisorbed molecules of the precursor (bonded by the Van der Waals force) are desorbed from the substrate. However, chemisorbed molecules of the precursor are covalently bonded, and hence, these molecules are strongly adsorbed in the substrate. Hence, the chemisorbed molecules are not desorbed from the substrate. The ALD is performed using the properties that the chemisorbed molecules of the precursor (adsorbed in the substrate) react and/or replace a reactant precursor.

More specifically, a source precursor is injected into a chamber so that the source precursor is excessively adsorbed on a substrate. Then, the excessive precursor or physisorbed molecules are removed by injecting a purge gas and/or pumping the chamber, causing only chemisorbed molecules to remain on the substrate. The chemisorbed molecules results in a mono molecule layer. Subsequently, a reactant precursor (or replacement agent) is injected into the chamber. Then, the excessive precursor or physisorbed molecules are removed by injecting the purge gas and/or pumping the chamber, obtaining a final atomic layer.

In the ALD, a basic unit consisting of these four processes is usually referred to as a cycle. If a chemisorbed layer in a saturation state is obtained, a deposition velocity of about 1 Å per cycle is obtained. However, when a precursor is not adsorbed on the substrate in the saturation state, a deposition velocity is slower than about 1 Å per cycle. If the physisorbed molecule layer is not completely removed but a portion of the physisorbed molecule layer remains on the substrate, the deposition velocity is increased.

In the ALD, one atomic monolayer is usually formed per cycle. In the ALD, a source precursor, a reactant precursor and a purge gas are repeatedly injected into a chamber, and a valve and a pump are used for exhaustion. For example, the ALD technique has been disclosed in U.S. Pat. Nos. 7,422,636, 7,402,210, 6,511,539 and 6,820,570, which are incorporated by reference herein in their entirety.

If precursors injected into a chamber in each process remain in the chamber, a vapor phase reaction (referred to as a CVD reaction) occurs through the reaction of a source precursor and a reactant precursor. Therefore, only a valve for ALD operated at a high speed is necessary to perform the ALD, and purging and/or pumping must be performed so that no precursor remains in the chamber. At this time, the valve used for ALD requires an extended operation times. For example, operation times of more than $10^3$ for each of the processes of injecting the source precursor, purging, injecting the reactant precursor, purging and the like are usually necessary to deposit an atomic layer with a thickness of 100 nm. As a result, the lifetime of the valve is shortened, and its reliability is decreased. As the number of operation times of the valve operated at a high speed is increased, problems related to the lifetime of the valve occur, such as erroneous operations or particles.

However, when a thin film is formed using the ALD, it is important to form the thin film having uniform characteristics (i.e., physical, chemical and electrical characteristics) required to satisfy requirements of a device. To this end, it is necessary that times at which the respective source and reactant precursors reach a substrate be identical in the injection of the source and the reactant precursor. In the cross-flow or traveling-wave type reactor in which precursors used for the ALD are injected parallel to a substrate, an adsorption phenomenon is gradually performed while the substrate is passes from the side adjacent to an injection portion of the precursors and to the side of an exhaust portion. Therefore, the adsorption phenomenon is represented by a function of time. Particularly, for a large-area substrate, such a phenomenon becomes more pronounced, and therefore, the composition, thickness or property of the thin film varies depending on each portion of the substrate. Particularly, the compositions, thicknesses or properties of the thin films respectively positioned at the injection and exhaust portions are different from each other.

In the reactor for receiving the precursors, the precursors are injected in a direction vertical to the substrate to avoid such a problem. However, when the distance between the injection portion (typically, showerhead) of the precursors and the substrate is short, the thickness of the thin film is increased or decreased by the proximity phenomenon in the vicinity of a hole of the showerhead through which the precursors are injected, and therefore, an irregular thin film having a hole pattern of the showerhead is obtained. Accordingly, the distance between the injection portion and the substrate need to be sufficiently large. As a result, the space portion of the chamber is increased. Also, a large amount of precursor is required because a sufficient amount of precursor is necessarily filled in the interior of the chamber for the purpose of saturation adsorption of precursors on a surface of the substrate. Also, the source precursors and the reactant precursors do not come in contact with each other so as to avoid a CVD reaction. Therefore, much time is taken to perform sufficient purging and/or pumping to prevent the source precursors or reactant precursors from remaining in the chamber. In addition, since the source precursors and the reactant precursors are exhausted through the same exhaust line, a reactant byproduct (e.g., powder, gum or the like) is produced by the reaction of these precursors. Therefore, the reliability, durability and economy of the device are decreased as well as yielding thinner film.

In U.S. Pat. No. 6,821,563, for example, gas steam flowed through a plurality of gas ports is supplied to a substrate, and purge and pump ports are installed adjacent to each other so that the ALD is performed by purging and pumping while consecutively injecting precursors. However, partitions for isolating or separating the ports from each other are installed, and pumping ports are positioned at both sides of each of the partitions, respectively. Hence, its structure is complicated. In addition, since the partitions serve as only physical barriers for isolating the ports from each other, there is a structural limitation in that pumping ports are necessarily positioned at both sides (or left and right sides) of each of the ports through which the precursors are injected or purged.

SUMMARY OF THE INVENTION

Embodiments provide a vapor deposition reactor of a closed-loop type, which performs within its interior, a series of processes of adsorbing a source precursor or a reactant precursor on a substrate, desorbing physisorbed molecule layer of the source precursor or the reactant precursor and externally exhausting the desorbed molecule layer.

In one embodiment, the vapor deposition reactor includes at least one first injection portion. The at least one first injection portion injects a first material. A first portion of the vapor deposition reactor has a first recess formed therein. The first recess is connected to the at least one first injection portion to receive the first material. A second portion is adjacent to the first portion and has a second recess formed therein. The second recess is connected to the first recess so that the first material via the first recess. A third portion has a third recess formed therein that is connected to the second recess, and receives the first material via the second recess. The pressure of the third recess is maintained lower than the first recess by an exhaust portion. A substrate moves across the first recess, the second recess and the third recess to absorb the first material in its surface.

In one embodiment, the first portion includes a plurality of first recesses, and the second portion includes a plurality of second recesses. The vapor deposition reactor may be configured by sequentially connecting the recesses in one of the first recesses, one of the second recesses, the third recess of the third portion, another of the first recesses and another of the second recesses.

In one embodiment, the vapor deposition reactor further includes an additional first portion and an additional second portion. The additional first portion and the additional second portion have an additional first recess and an additional second recess formed therein, respectively. The pressure in the additional second recess is lower than the pressure in the additional first recess. The additional first and second recesses are filled with a second material. The substrate moves across the first and second recesses to absorb the second material on the substrate.

BRIEF DESCRIPTION OF THE DRAWINGS

The above and other aspects, features and advantages of the present invention will become apparent from the following description of preferred embodiments given in conjunction with the accompanying drawings, in which:

FIG. 10B is a bottom view of the vapor deposition reactor of FIG. 10A, according to one embodiment.

FIG. 11 is a sectional view of a vapor deposition reactor, according to one embodiment.

FIG. 13A is a sectional view of a vapor deposition reactor, according to one embodiment.

FIG. 14 is a sectional view of a vapor deposition reactor, according to one embodiment.

FIG. 15A is a sectional view of a vapor deposition reactor, according to one embodiment.

FIG. 21B is a schematic sectional view of a coaxial plasma generator of the experimental apparatus of FIG. 19, according to one embodiment.

DETAILED DESCRIPTION OF THE INVENTION

Figure 1A:
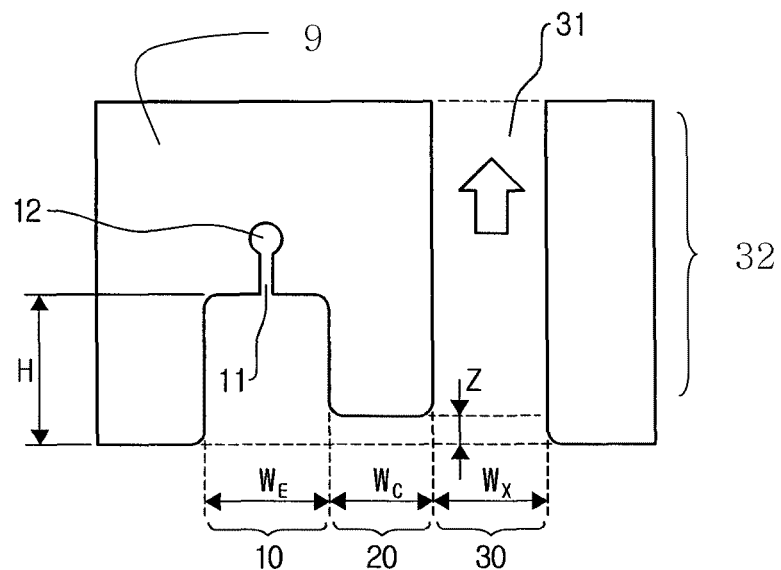
FIG. 1A is a sectional view of a vapor deposition reactor according to one embodiment.

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein. Rather, these example embodiments are provided so that this disclosure will be thorough and complete, and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first", "second", and the like does not imply any particular order, but they are included to identify individual elements. Moreover, the use of the terms first, second, etc. does not denote any order or importance, but rather the terms first, second, etc. are used to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements. The shape, size and regions, and the like, of the drawing may be exaggerated for clarity.

Figure 1B:
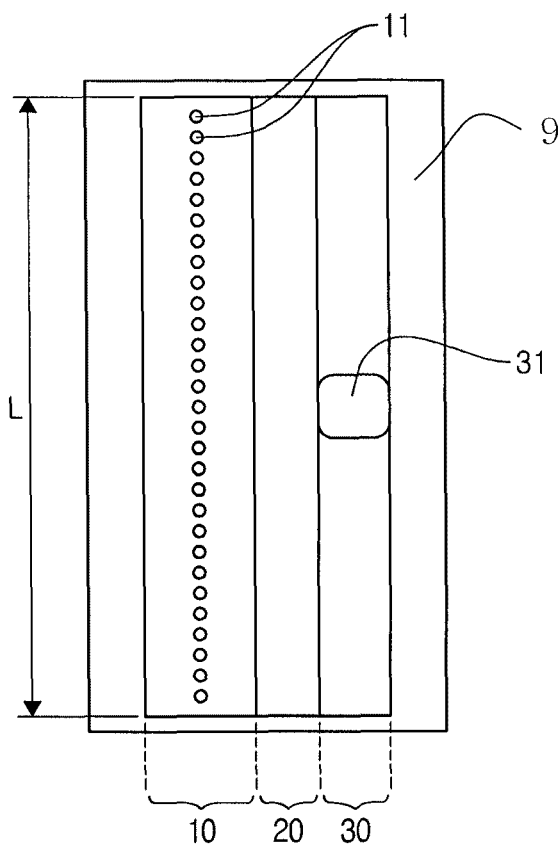
FIG. 1B is a bottom view of the vapor deposition reactor of FIG. 1A, according to one embodiment.

FIG. 1A is a sectional view of a vapor deposition reactor according to an embodiment. FIG. 1B is a bottom view of the vapor deposition reactor of FIG. 1A. A body 9 of the vapor deposition reactor includes a first portion 10, a second portion 20 and a third portion 30. Recesses or space formed in the first, second and third portions 10, 20 and 30 may be connected to one another to allow gas to communicate. The vapor deposition reactor may include one or more injection portions 11 for injecting a reacting material into the first portion 10. The injection portions 11 may be connected to a channel 12 through which the reacting material is transported.

For example, when the vapor deposition reactor is used in atomic layer deposition (ALD), the reacting material may be a source precursor or reactant precursor. The source precursor may be determined depending on the type of thin film to be ultimately formed in the vapor deposition reactor. For example, the source precursor may be a compound containing atoms for forming a metal, insulator or semiconductor thin film, and an organic or inorganic compound may all be use as the source precursor. The reactant precursor is a material that forms a metal, oxide, nitride, carbide, material for semiconductor, or the like through reaction and/or replacement of the reactant precursor with the source precursor, thereby obtaining a thin film. For example, the reactant precursor may include one or more of $H_2O$, $H_2O_2$, $O_2$, $N_2O$, NO, $O_3$, O* radical, $NH_3$, $NH_2$—$NH_2$, N* radical, CO, $CO_2$, $CH_4$, $C_2H_6$, $H_2$ and H* radical.

In one embodiment, a substrate (not shown) may pass by the first to third portions 10 to 30 by moving across the vapor deposition reactor so that an atomic-layer or molecular-layer thin film is formed on the substrate. For example, the substrate may be moved in a linear or rotating manner adjacent to a lower portion of the vapor deposition reactor so that a thin film is formed on the substrate. In another embodiment, the vapor deposition reactor may be moved with respect to the substrate with the substrate fixed.

The first and second portions 10 and 20 include square-column-shaped recesses formed on a bottom portion of the body 9 of the vapor deposition reactor and have predetermined widths $W_E$ and $W_C$, heights H and z and lengths L. The third portions 30 may have predetermined width $W_X$ and length L, and an upper portion of the third portion 30 may be connected to an exhaust portion 32 in which an exhaust portion 31 is formed. The structure of the vapor deposition reactor is merely illustrative. That is, the shapes of the first to third portions 10 to 30 may be configured differently from those described above depending on the object of the vapor deposition reactor.

The width of each of the first to third portions 10 to 30 herein refers to the dimension of recess formed in the first to third portions 10 to 30 parallel to the moving direction of the substrate. Also, the length of each of the first to third portions 10 to 30 refers to the dimension of each of the first to third portions 10 to 30 in the direction perpendicular to the movement direction of the substrate. Also, the height of each of the first and second portions 10 and 20 refers to the distance between a lower surface of the body 9 and an inner upper surface of the corresponding recesses in the first and second portions 10 and 20.

Properties of the thin film formed on the substrate may be determined at least partially based on the width $W_E$ and height H of the first portion 10, the width $W_C$ and height z of the second portion 20, the width $W_X$ of the third portion 30, and the movement velocity v of the substrate. For example, assuming that the movement velocity of the substrate is v and the width of a corresponding portion through which the substrate passes among the first to third portions 10 to 30 is x, the exposure time of the substrate for the corresponding portion is determined by the following equation:

$$t = x/v \qquad (1)$$

The recess of the first portion 10 may be filled with the reacting material injected through the injection portion 11. If the substrate moving at the movement velocity v passes by the lower portion of the first portion 10, the substrate is exposed to the reacting material for time $W_E/v$. As a result, physisorbed and chemisorbed layers of the reacting material may be formed on the substrate. As the width $W_E$ of the first portion 10 is increased, an increasing amount of the reacting material is supplied to the first portion 10. As the width $W_E$ of the first portion 10 is decreased, the possibility that the reacting material is adsorbed on the substrate is decreased. Therefore, in designing the vapor deposition reaction, the width $W_E$ of the first portion 10 may be determined based on the property of the reacting material. As the steam pressure of the reacting material is increased, the width $W_E$ of the first portion 10 may be decreased, and/or the movement velocity v of the substrate may be increased. As a result, the amount of reacting material adsorbed on the substrate can be adjusted since the period during which the substrate resides at the first portion 10 is decreased.

The substrate passing by the lower portion of the first portion 10 subsequently passes by a lower portion of the second portion 20. The pressure $P_C$ in the recess of the second portion 20 may be relatively lower than the pressure $P_E$ in the recess of the first portion 10 ($P_C < P_E$). As a result, a portion of the reactant precursor adsorbed on the substrate may be desorbed for time $W_C/v$ during which the substrate passes by the lower portion of the second portion 20. For example, the physisorbed layer of the reacting material may be desorbed from a surface of the substrate while the substrate passes by the lower portion of the second portion 20.

The substrate passing by the lower portion of the second portion 20 subsequently passes by a lower portion of the third portion 30. The reacting material desorbed from the substrate while the substrate posses by the second portion 20 may be discharged to the exterior of the vapor deposition reactor through the exhaust portion 31 for time $W_X/v$ at which the substrate passes by the lower portion of the third portion 30. As a result, the physisorbed layer of the reacting material is at least partially removed from the substrate but the chemisorbed layer of the reacting material remains on the substrate. In an embodiment, the pressure $P_X$ in the third portion 30 may be relatively lower than the pressure $P_E$ in the first portion 10 ($P_X < P_E$).

As described above, while a substrate passes by the first to third portions 10 to 30 of the vapor deposition reactor, a series of processes is performed. During the series of processes, the substrate is exposed to a reacting material such as a source precursor and/or reactant precursor, and the reacting material is adsorbed in the surface of the substrate. Then, a physisorbed layer of the reacting material is desorbed from the substrate for at least partially removal from the substrate, and a chemisorbed layer of the reacting material is formed on the substrate.

The aforementioned processes may be performed using a source precursor as the reacting material in one vapor deposition reactor, and the aforementioned processes may be performing using a reactant precursor as the reacting material in a subsequent vapor deposition reactor. As a result, the substrate passes by four processes of adsorbing a source precursor, removing a physisorbed layer, adsorbing a reactant precursor and removing the physisorbed layer to form a thin film on the substrate. The produced thin film may be an atomic layer or mono molecule layer or may include a plurality of molecule layers. The moving velocity of the substrate that passes by the vapor deposition reactor filled with the source precursor may be controlled to be identical to or different from the moving velocity of the substrate that passes by the vapor deposition reactor filled with the reactant precursor.

The aforementioned processes may also be performed using a single vapor deposition reactor by injecting a source precursor and a reactant precursor alternately into the recess of the first portion 10 of the vapor deposition reactor. For example, a valve for ALD (not shown) and its driving unit may be connected to the channel 12. The source precursor and the reactant precursor may be injected in an alternating manner according to the opening or closing of the valve. Further, an inert gas may be injected as a purge gas after the injection of each of the source precursor and the reactant precursor. In this case, the substrate that passes by the first portion 10 undergoes the following four steps: adsorbing the source precursor, injecting the inert gas, adsorbing the reactant precursor and injecting the inert gas. As a result, an atomic layer thin film may be formed on the substrate. A portion of the precursor adsorbed on the substrate and/or the inert gas may be desorbed from the substrate and discharged while the substrate passes by the second portion 20 and the third portion 30.

When a source precursor, an inert gas and a reactant precursor are injected into a single vapor deposition reactor in an alternating manner, the moving velocity of the substrate that passes by the single vapor deposition reactor may be relatively smaller than the moving velocity of a substrate that passes by another vapor deposition reactor into which only one of the source precursor and the reactant precursor is injected. For example, the moving velocity of the substrate may be controlled such that the substrate is sequentially exposed to a source precursor, an inert gas, a reactant precursor and an inert gas while the substrate passes by one first portion 10. When the ALD is performed according to the aforementioned processes, an atomic layer thin film may be formed using the single vapor deposition reactor. Thus, the number of atomic layer thin films which are formed using the same number of vapor deposition reactors may be increased.

Meanwhile, the lower portion of the vapor deposition reactor may be spaced apart from the substrate. For example, the lower portion of the vapor deposition reactor may be spaced apart from the substrate at about 0.5 mm to a few millimeters. Alternatively, the interval between the lower portion of the vapor deposition reactor and the substrate may be about 1 mm. When the interval between the lower portion of the vapor deposition reactor and the substrate is sufficiently small (e.g., when the interval between the lower portion of the vapor deposition reactor and the substrate is about 1 mm or less), the amount of the reacting material leaked to the exterior from the vapor deposition reactor may be negligible. However, in order to minimize the amount of the leaked reacting material, an inert gas may be injected around the vapor deposition reactor, or pumping may be performed around the vapor deposition reactor. In this case, the inert gas may include one or more gas selected from the group consisting of $N_2$, Ar and He.

The shapes of the first and second portions 10 and 20 affect effective desorption of the reacting material adsorbed on the substrate. Experiments were conducted using the first and second portions 10 and 20 having various shapes to derive parameters related to the desorption of the reacting material. For example, trimethylaluminum (TMA) is sufficiently adsorbed on a substrate maintained at about 250° C. for one second, and the substrate is then passed by the lower portion of the vapor deposition reactor. At this time, an inert gas such as Ar gas may be injected into the first portion 10. Since the pressure of the Ar gas is lowered while the substrate passes by a lower portion of the second portion 20, molecules of the TMA adsorbed on the substrate are desorbed, and the desorbed molecules of the TMA may be exhausted together with the Ar gas to the exterior via the third portion 30. In this case, the desorption is examined while changing the shapes of the first and second portions 10 and 20. Alternatively, the desorption may be examined using the thickness of an atomic-layer thin film formed by the vapor deposition reactor.

The correlation of the width $W_E$ of the first portion 10, the height z of the recess in the second portion 20 and the desorption are examined using a vapor deposition reactor in which the height H of the first portion 10 is greater than the width $W_E$ of the first portion 10. As a result, the results of the following Table 1 were obtained. At this time, the experiment is performed in a state where the width $W_E$ of the first portion 10 was identical to the width $W_X$ of the third portion 30 and the width $W_C$ of the second portion 20 was about ½ of the width $W_E$ of the first portion 10.

TABLE 1

| Item | $0 < z \leq W_E/3$ | $W_E/3 < z \leq 2W_E/3$ | $2W_E/3 < z \leq W_E$ |
|---|---|---|---|
| Desorption phenomenon | Yes | Yes | Negligible |
| Material on substrate | Chemisorbed molecules | Chemisorbed molecules + some of physisorbed molecules | Chemisorbed molecules + physisorbed molecules |
| Deposition characteristic of thin film through adsorption | Formation of mono atomic-layer thin film by chemisorbed layer | Formation of plural atomic-layer thin films by chemisorbed layer and physisorbed layer | Formation of incomplete atomic-layer thin film |

Also, the correlation of the width $W_C$ of the second portion 20, the height z of the second portion 20 and the desorption are examined using a vapor deposition reactor in which the height H of the first portion 10 is greater than the width $W_E$ of the first portion 10. As a result, following Table 2 was obtained. The experiment was performed in a state where $W_E$ of the first portion 10 is identical to the width $W_X$ of the third portion 30 and the height z of the second portion 20 is about ½ of the width $W_E$ of the first portion 10.

TABLE 2

| Item | $0 < W_C \leq 0.5z$ | $0.5z < W_C \leq 3z$ | $W_C > 3z$ |
|---|---|---|---|
| Desorption phenomenon | Negligible | Yes | Yes |
| Material on substrate | Chemisorbed layer + physisorbed layer | Chemisorbed layer + portion of physisorbed layer | Chemisorbed layer |
| Deposition characteristic of thin film through adsorption | Formation of incomplete atomic-layer thin film | Formation of plural atomic-layer thin films by the chemisorbed layer and physisorbed layer | Formation of mono atomic-layer thin film by chemisorbed layer |

On the other hand, the correlation of the height H of the first portion 10, the height z of the second portion 20 and the desorption are examined using a vapor deposition reactor in which the height H of the first portion 10 is smaller than the width $W_E$ of the first portion 10. As a result, following Table 3 was obtained. The experiment is performed in a state where the width $W_C$ of the second portion 20 is about ½ of the width $W_X$ of the third portion 30.

TABLE 3

| Item | $0 < z \leq H/3$ | $H/3 < z \leq 2H3$ | $2H3 < z \leq H$ |
|---|---|---|---|
| Desorption phenomenon | Yes | Yes | Negligible |
| Material on substrate | Chemisorbed layer | Chemisorbed layer + portion of physisorbed layer | Chemisorbed layer + physisorbed layer |
| Deposition characteristic of thin film through adsorption | Formation of mono atomic-layer thin film by chemisorbed layer | Formation of plural atomic-layer thin films by chemisorbed layer and physisorbed layer | Formation of incomplete atomic-layer thin film |

In Tables 1 to 3, when the height z of the second portion 20 is zero, the reacting material is leaked and diffused around the vapor deposition reactor, and hence, the desorption caused by the second portion 20 cannot be assessed. The result obtained when the height z of the second portion 20 is zero is not represented in Tables 1 to 3.

As can be seen from the results of Tables 1 to 3, the desorption effect is increased as the height z of the second portion 20 is decreased. Also, it can be seen that the desorption effect is increased as the width $W_C$ of the second portion 20 is increased when the height z of the second portion 20 is constant. In an embodiment, the width $W_C$ of the second portion 20 may be greater than about ½ of the height z of the second portion 20. In another embodiment, the height z of the second portion 20 may be greater than zero and equal to or less than ⅔ of the width $W_E$ of the first portion 10. Alternatively, the height z of the second portion 20 may be greater than zero and equal to or less than ⅔ of the height H of the first portion 10. In still another embodiment, the height z of the second portion 20 may be equal to or less than the width $W_X$ of the third portion 30.

Figure 1C:
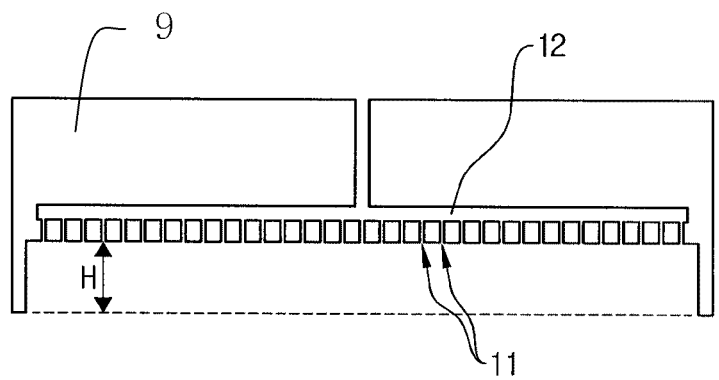
FIG. 1C is a sectional view of a first portion in the vapor deposition reactor of FIG. 1A, according to one embodiment.
Figure 1D:
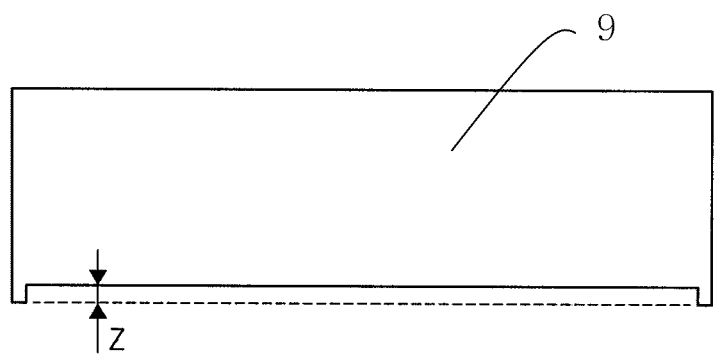
FIG. 1D is a sectional view of a second portion in the vapor deposition reactor of FIG. 1A, according to one embodiment.
Figure 1E:
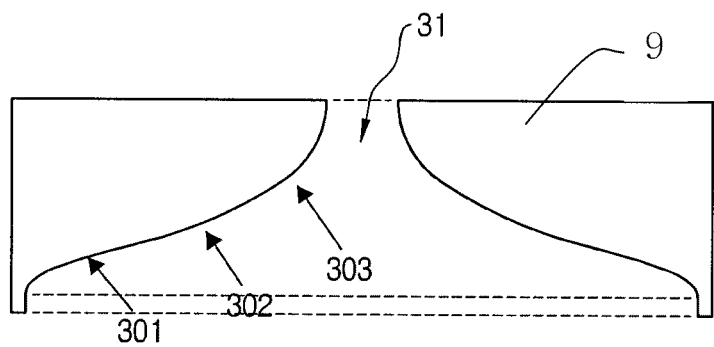
FIG. 1E is a sectional view of a third portion in the vapor deposition reactor of FIG. 1A, according to one embodiment.

FIG. 1C is a sectional view of the first portion 10 in the vapor deposition reactor described above. FIG. 1D is a sectional view of the second portion 20 in the vapor deposition reactor. FIG. 1E is a sectional view of the third portion 30 in the vapor deposition reactor.

Referring to FIG. 1E, to maximize conductance while the substrate passes by the third portion 30, the curve connected to the exhaust portion 31 in the third portion 30 may be configured to have different curvatures from one another at a plurality of portions 301, 302 and 303. For example, since the curvature at one portion 301 has a negative (−) value, the portion 301 has a shape that is concave outward from the third portion 30. Meanwhile, since the curvature at another portion 303 has a positive (+) value, the portion 303 has a shape that is convexed inward to the third portion 30. The other portion 302 corresponds to an inflection point between the two portions 301 and 303.

Figure 2A:
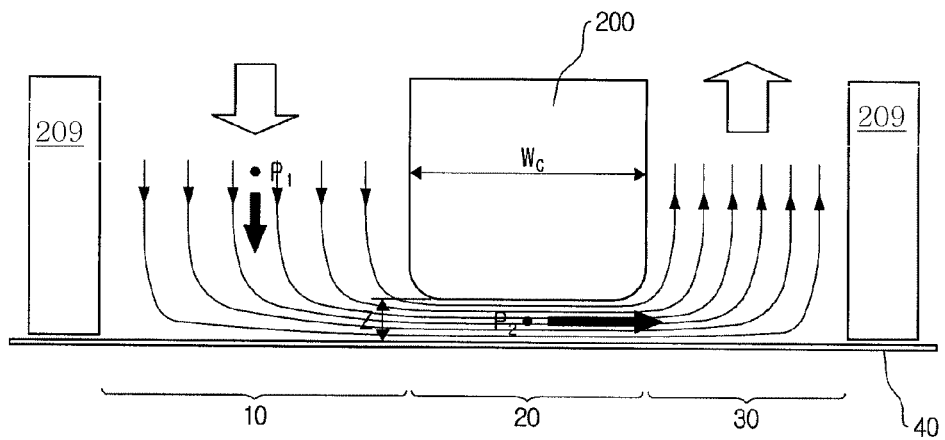
FIGS. 2A to 2D are partial sectional views of vapor deposition reactors, according to embodiments.

FIG. 2A is a partial sectional views of a second portion 20 in a vapor deposition reactor according to an embodiment. A first portion 10, a second portion 20 and a third portion 30 are provided at a lower portion of a body 209 of the vapor deposition reactor. The second portion 20 is positioned between first and third portions 10 and 30. The second portion has a recess defined by a partition 200 having a predetermined width $W_C$ and is positioned at a predetermined distance z from a substrate 40. The pressure $P_2$ of the second portion 20 is lower than the pressure $P_1$ in the first portion 10. As a result, while the substrate passes by the second portion 20, a physisorbed layer of a reacting material adsorbed on the substrate 40 may be desorbed from the substrate 40 due to the lower pressure.

Figure 2B:
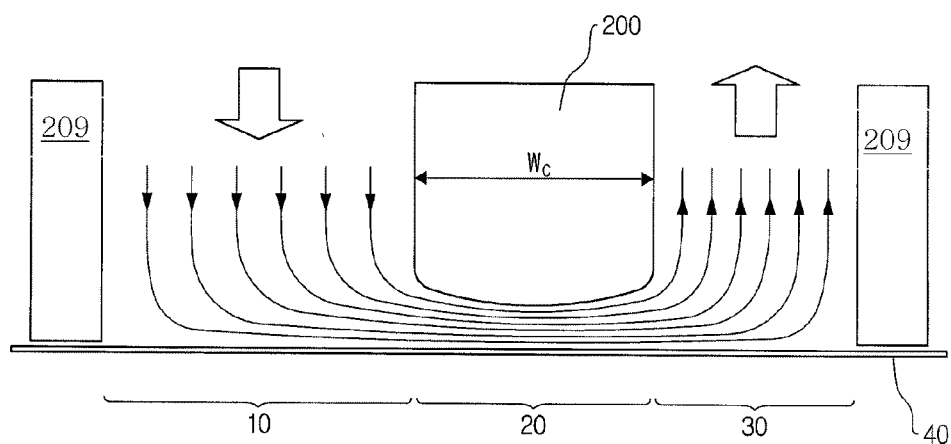
Figure 2C:
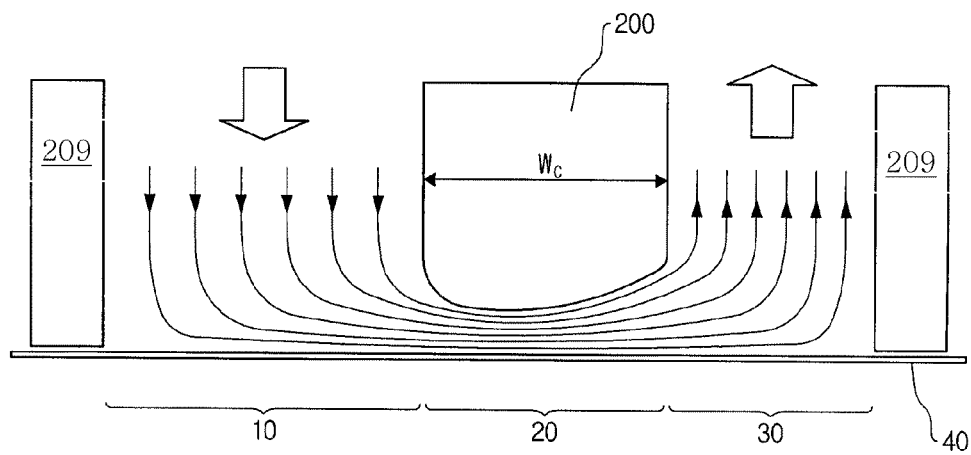
Figure 2D:
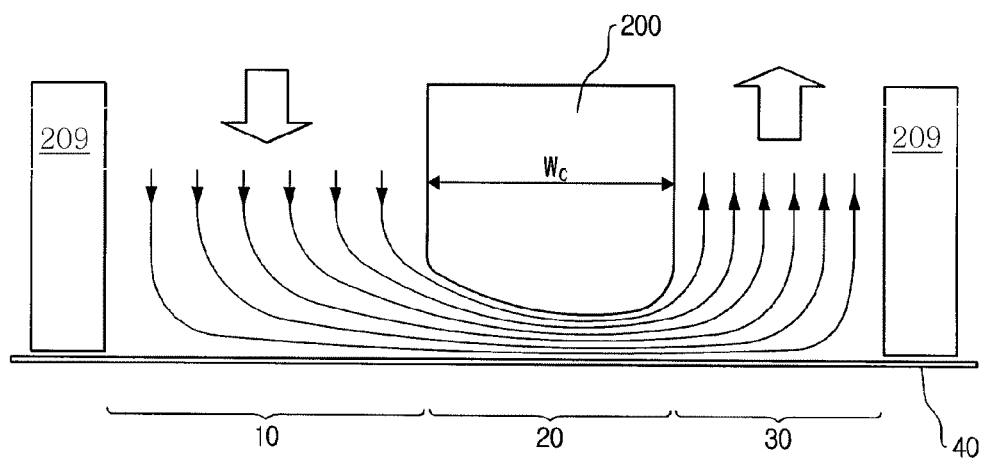

In the second portion 20 shown in FIG. 2A, the surface of the partition 200 is formed parallel to a surface of the substrate 40. However, in another embodiment, the surface of the partition 200 may be formed to have a curved surface shape having varying height with respect to the surface of the substrate 40. For example, FIG. 2B shows a second portion 20 defined by a partition 200 having a surface that is convexed toward the substrate 40. The partition 200 shown in FIG. 2B has a lower surface that is symmetric about the center thereof. However, in another embodiment, the lower surface of the partition 200 may be formed asymmetric. For example, FIG. 2C shows a second portion 20 defined by a partition 200 formed to have a surface that has relatively a large height gradient at a region adjacent to the first portion 10. To the contrary, FIG. 2D shows a second portion 20 defined by a partition 200 formed to have a surface that has a relatively large height gradient at a region adjacent to the third portion 30.

Meanwhile, in case of a rotary type vapor deposition reactor in which a plurality of substrates are loaded and then deposited while being rotated, an angular velocity is varied depending on the radius of rotation. For example, when the substrates are loaded on a rotating table and the table is activated, the angular velocity at the outside of the rotating table is greater than that at the inside of the rotating table. In this case, the time during which a portion of the substrate at the outside of the rotating table is subject to the processing by the vapor deposition reactor is different from the time during which another portion of the substrate inside the rotating table is exposed to the vapor deposition reactor, and therefore, the desorption rates of the reacting material at both of the portions are different from each other.

Figure 3:
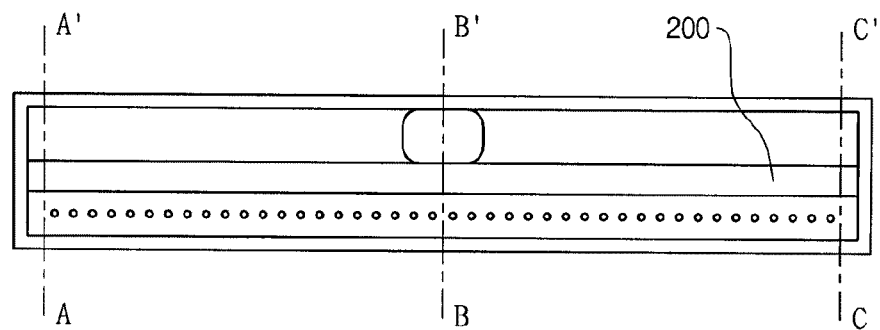
FIG. 3 is a bottom view of a vapor deposition reactor, according to one embodiment.
Figure 4A:
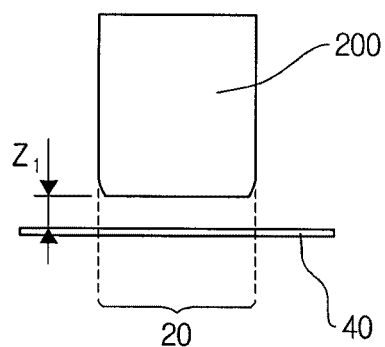
FIGS. 4A to 4C are partial sectional views of the vapor deposition reactor of FIG. 3, according to one embodiment.
Figure 4B:
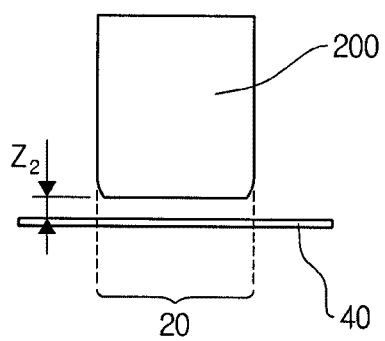
Figure 4C:
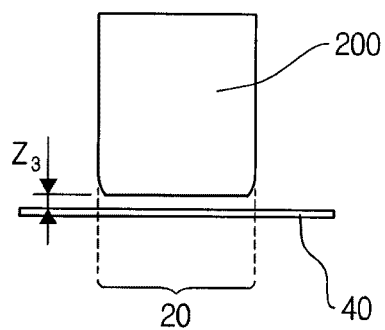

FIG. 3 is a bottom view of a vapor deposition reactor that may be used when the velocity at which a substrate passes by the vapor deposition reactor is different at regions. FIG. 4A is a sectional view of a second portion taken along line A-A' of FIG. 3. FIG. 4B is a sectional view of the second portion taken along line B-B' of FIG. 3. FIG. 4C is a sectional view of the second portion taken along line C-C' of FIG. 3.

Referring to FIGS. 4A to 4C, the height $Z_3$ of the recess in the second portion 20 at portion C-C' of the vapor deposition reactor may be smaller than the height $Z_1$ of the recess in the second portion 20 at portion A-A' of the vapor deposition reactor ($Z_1 > Z_3$). The height $Z_2$ of the second portion 20 at portion B-B' of the vapor deposition reactor may have a value between the heights $Z_1$ and $Z_3$ of the second portion 20 at both end portions of the vapor deposition reactor ($Z_1 > Z_2 > Z_3$). As the height of the second portion 20 is decreased, the pressure in the second portion 20 is decreased, and therefore, the desorption rate of the reacting material is increased on the substrate that passes by a corresponding portion. Thus, a portion moving at a greater velocity passes by the portion C-C' of the vapor deposition reactor, and a portion moving at a lower velocity passes by the portion A-A' of the vapor deposition reactor, thereby equalizing the desorption rate across the entire region of the substrate.

Figure 5:
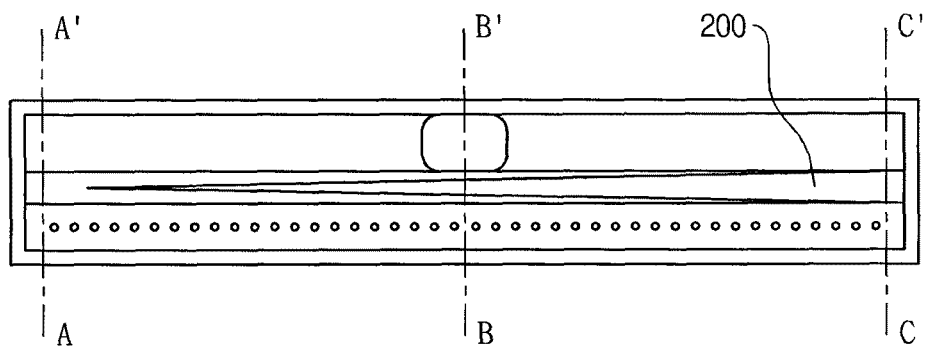
FIG. 5 is a bottom view of a vapor deposition reactor according to still another embodiment.
Figure 6A:
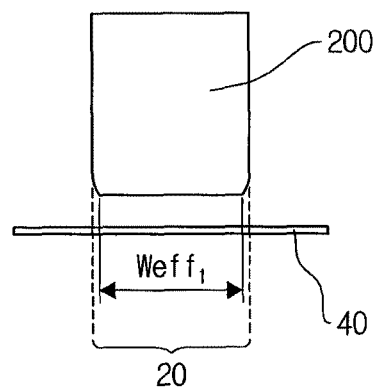
FIGS. 6A to 6C are partial sectional views of the vapor deposition reactor of FIG. 5, according to one embodiment.
Figure 6B:
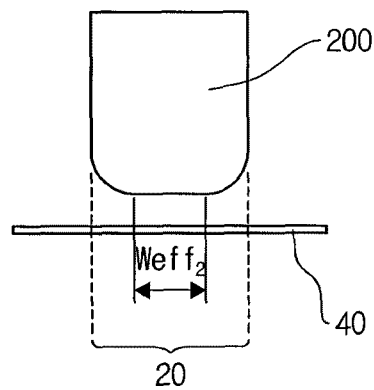
Figure 6C:
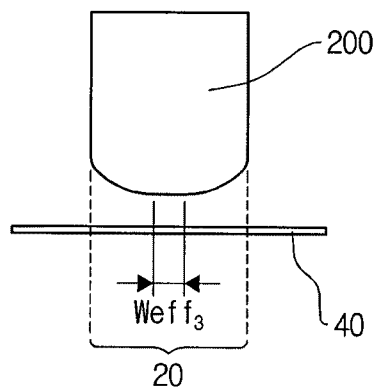

FIG. 5 is a bottom view of another vapor deposition reactor that may be used when the velocity at which a substrate passes by the vapor deposition reactor differs at regions. FIG. 6A is a sectional view of a second portion taken along line A-A' of FIG. 5. FIG. 6B is a sectional view of the second portion taken along line B-B' of FIG. 5. FIG. 6C is a sectional view of the second portion taken along line C-C' of FIG. 5.

Referring to FIG. 6A, a surface of a partition 200 at portion A-A' of the vapor deposition reactor may be parallel to a substrate 40. In this case, the entire width of the partition 200 becomes the effective width $W_{eff1}$ of the second portion 20 at the portion A-A'. Referring to FIG. 6B, the surface of the partition 200 at portion B-B' of the vapor deposition reactor may have a gradient with respect to the substrate 40. In this case, the effective width $W_{eff2}$ of the second portion 20 at the portion B-B' is limited to a region in which the surface of the partition 200 is parallel to the substrate 40, and therefore, is smaller than the effective width $W_{eff1}$ of the second portion 20 at the portion A-A' ($W_{eff1} > W_{eff2}$). Referring to FIG. 6C, as the gradient of the partition 200 at portion C-C' of the vapor deposition reactor is more increased, the effective width $W_{eff3}$ of the second portion 20 at the portion C-C' is smaller than the effective width $W_{eff2}$ of the second portion 20 at the portion B-B' ($W_{eff2} > W_{eff3}$).

Figure 7A:
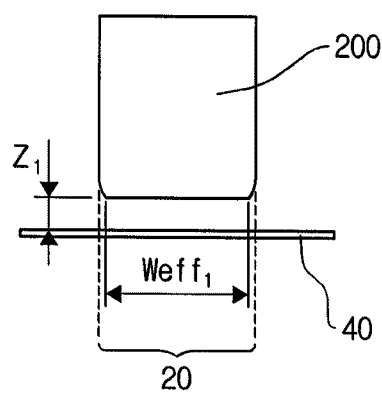
FIGS. 7A to 7C are partial sectional views of a vapor deposition reactor, according to one embodiment.
Figure 7B:
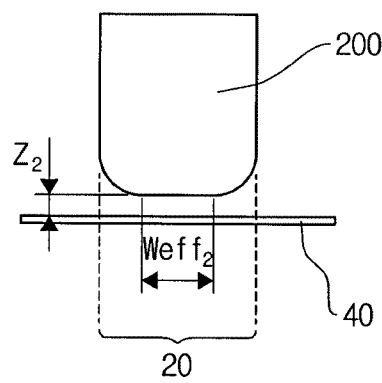
Figure 7C:
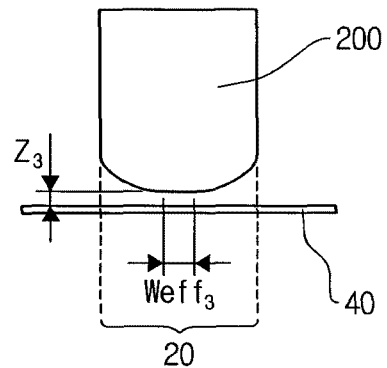

FIGS. 7A to 7C are sectional views of a second portion in a vapor deposition reactor according to still another embodiment. Referring to FIGS. 7A to 7C, the vapor deposition reactor according to the embodiment may have a structure obtained by combining the structure shown in FIGS. 4A to 4C and the structure shown in FIGS. 6A to 6C. That is, the height of a second portion 20 may be gradually decreased from one end portion to the other end portion of the vapor deposition reactor ($Z_1 > Z_2 > Z_3$). Also, As a substrate 40 passes from the one end portion to the other end portion of the vapor deposition reactor, the gradient of a partition 200 is increased, and therefore, the effective width of the second portion 20 may be gradually decreased ($W_{eff1} > W_{eff2} > W_{eff3}$).

Meanwhile, the shape of the vapor deposition reactor may be modified based on the type and property of a reacting material. Particularly, since adsorption and desorption characteristics differ depending on the shape of the second portion, the shape of the second portion may be optimized based the reacting material used. For example, when a precursor with a low vapor pressure and/or a high viscosity is used as the reacting material, a structure with a relatively high desorption rate is necessary. When, a precursor with a high vapor pressure and/or a low viscosity is used as the reacting material, a structure with a relatively low desorption rate is necessary. The characteristics of the second portion can be varied for different reacting materials in one vapor deposition reactor.

Figure 8A:
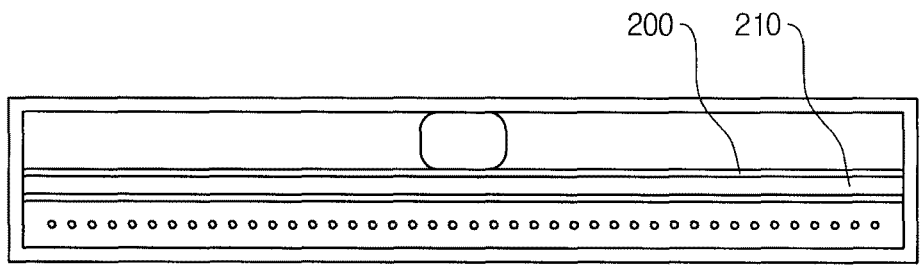
FIG. 8A is a bottom view of a vapor deposition reactor, according to one embodiment.

FIG. 8A is a bottom view of a vapor deposition reactor configured to vary characteristics of a second portion according to still another embodiment. The vapor deposition reactor according to the embodiment may include a partition 200 that defines the second portion and an adjustable wing 210 forming at least a partial region of the partition 200.

Figure 8B:
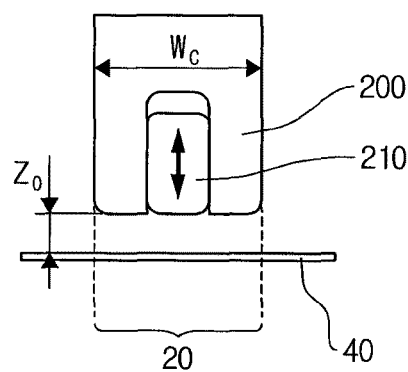
FIGS. 8B and 8C are partial sectional views of the vapor deposition reactor of FIG. 8A, according to one embodiment.
Figure 8C:
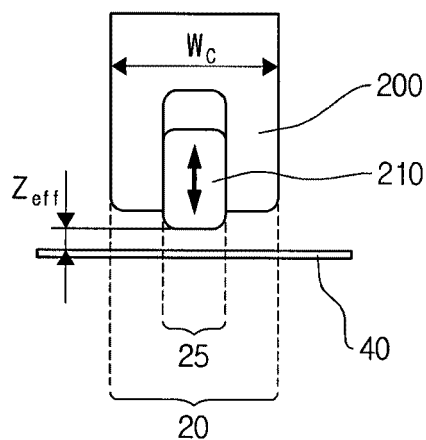

FIG. 8B is a sectional view of the second portion in the vapor deposition reactor of FIG. 8A. FIG. 8C is a sectional view of the second portion when the adjustable wing 210 is moved to a drive position in the vapor deposition reactor of FIG. 8A. If the adjustable wing 210 is moved from an initial position shown in FIG. 8B to a driving position shown in FIG. 8C, the effective height $Z_{eff}$ is decreased as compared with the initial height $Z_0$. Since the path of a gas that passes by the second portion 20 is lengthened due to the adjustable wing 210, the pressure in the region 25 adjacent to the adjustable wing 210 is further decreased. Thus, although the vapor deposition reactor having the same exhausting ability is used, the desorption rate of a reacting material can be changed by the adjustable wing 210, and accordingly, the deposition characteristic of a thin film can be changed. Also, reacting materials with different chemical properties such as viscosity or vapor pressure can be used in the same vapor deposition reactor.

Meanwhile, when the adjustable wing 210 is positioned at the driving position as shown in FIG. 8C, the reacting material desorbed from a substrate 40 may enter into a gap between the partition 200 and the adjustable wing 210. To address such a problem, an inert gas may be injected as a curtain gas between the partition 200 and the adjustable wing 210.

Figure 9A:
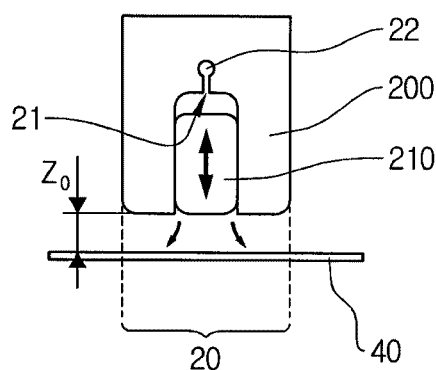
FIGS. 9A and 9B are partial sectional views of a vapor deposition reactor, according to one embodiment.
Figure 9B:
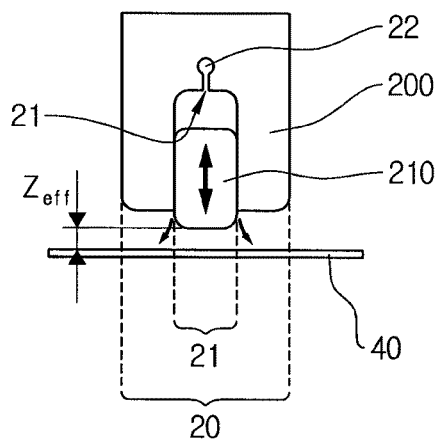

FIG. 9A is a sectional view of a second portion 20 in a vapor deposition reactor including an injection portion of curtain gas between a partition and an adjustable wing. FIG. 9B is a sectional view of the second portion when the adjustable wing 210 is moved to a drive position in the vapor deposition reactor of FIG. 9A. A channel 22 and one or more injection portions 21 may be formed at a region in the partition 200 above the adjustable wing. An inert gas may be injected as a curtain gas through the injection portion 21. For example, the inert gas may include one or more selected from the group consisting of $N_2$, Ar and He. The inert gas is injected at a higher pressure than that in the second portion 20, so that it is possible to prevent a reacting material desorbed from a substrate 40 from entering into the gap between the partition 200 and the adjustable wing 210.

In the embodiment described with reference to FIGS. 8 and 9, the adjustable wing 210 is inserted into the partition 200 to change the shape of a partial region of the second portion 20. However, in another embodiment, the position of the partition 200 may be moved along the direction in which the substrate 40 advances. If the position of the partition 200 is changed, the ratio $W_E/W_C$ of the width $W_E$ of the first portion 10 and the width $W_C$ of the second portion 20 is changed, and therefore, the amount of the reacting material adsorbed on the substrate 40 is changed. For example, when the partition 200 moves toward the first portion 10 from the initial position thereof, the desorption amount of the reacting material may be decreased in the first portion 10. On the other hand, when the partition 200 moves toward the second portion 20 from the initial position thereof, the adsorption amount of the reacting material may be increased in the first portion 10.

In still another embodiment, the adjustable wing 210 may change the distance z between the partition 200 and the substrate 40, i.e., the height z of the second portion 20. If the distance between the partition 200 and the substrate 40 is decreased, the height z of the second portion 20 is decreased, and the pressure in the second portion 20 is decreased. Therefore, the desorption rate of the reacting material from the substrate 40 may be increased. On the other hand, if the distance between the partition 200 and the substrate 40 is increased, the height z of the second portion 20 is increased, and the pressure in the second portion 20 is increased. Therefore, the desorption rate of the reacting material from the substrate 40 may be decreased.

According to the aforementioned embodiments, reacting materials with different viscosity can be used in the vapor deposition reactor having the same size by using the adjustable wing. Also, the deposition characteristic of an atomic-layer thin film and/or the desorption rate of adsorbed molecules can be changed by using the vapor deposition reactor.

Figure 10A:
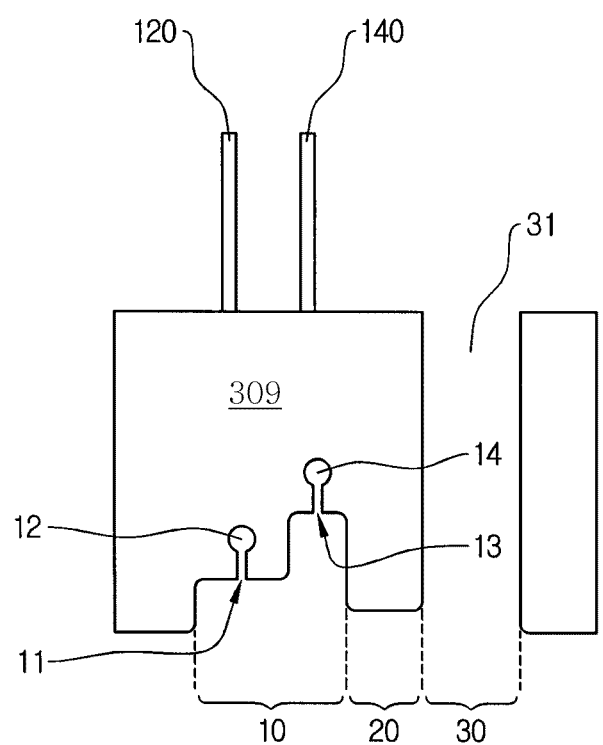
FIG. 10A is a sectional view of a vapor deposition reactor, according to one embodiment.

FIG. 10A is a sectional view of a vapor deposition reactor according to still another embodiment. FIG. 10B is a bottom view of the vapor deposition reactor of FIG. 10A. The vapor deposition reactor includes a body 309. One or more first injection portions 11 for injecting a reacting material, and one or more second injection portions 13 for injecting an inert gas are formed in the body 309. The first injection portion 11 may be connected to a first channel 12 through which the reacting material is transported, and a second injection portion 13 may be connected to the second channel 14 through which the inert gas is transported. The first channel 12 may be connected to a transfer pipe 120 through which the reacting material is injected from the exterior of the vapor deposition reactor, and the second channel 14 may be connected to a transfer pipe 140 through which the inert gas is injected from the exterior of the vapor deposition reactor. The first and second injection portions 11 and 13 are provided in a first portion 10 to fill the recess in the first portion 10 with the reacting material and the inert gas.

Figure 12:
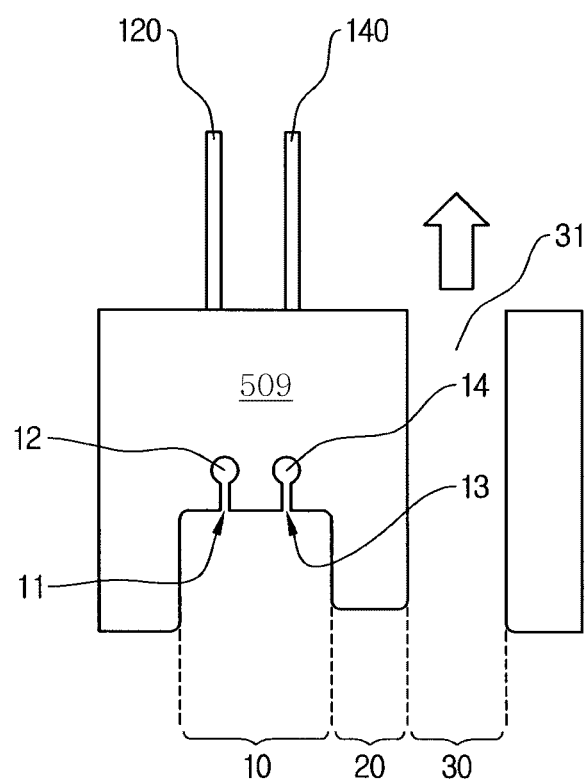
FIG. 12 is a sectional view of a vapor deposition reactor, according to one embodiment.

As shown in FIG. 10A, the second injection portion 13 is placed further away from a substrate (i.e., the second injection portion 13 has a higher height) than the first injection portion 11. However, the embodiment is provided only for illustrative purposes. In another embodiment, as shown in FIG. 11, the vapor deposition reactor includes a body 409 having a first injection portion 11 and a second injection portion 13 formed therein where the second injection portion 13 is formed at a position closer from the substrate than the first injection portion 11. Alternatively, as shown in FIG. 12, the first and second injection portions 11 and 13 may be formed at substantially the same distance from the substrate.

By using the vapor deposition reactors as described above, an inert gas can be injected together with a source precursor or reactant precursor into the recess of the first portion 10. The inert gas functions to purge the reacting material adsorbed on the substrate while the substrate passes by the second portion 20, and therefore, the amount of physisorbed layer that remains on the substrate is less than that of physisorbed layer that remains on the substrate when only the source precursor or reactant precursor is used. Thus, the vapor deposition reactor is advantageous in formation of an atomic mono-layer.

Figure 13B:
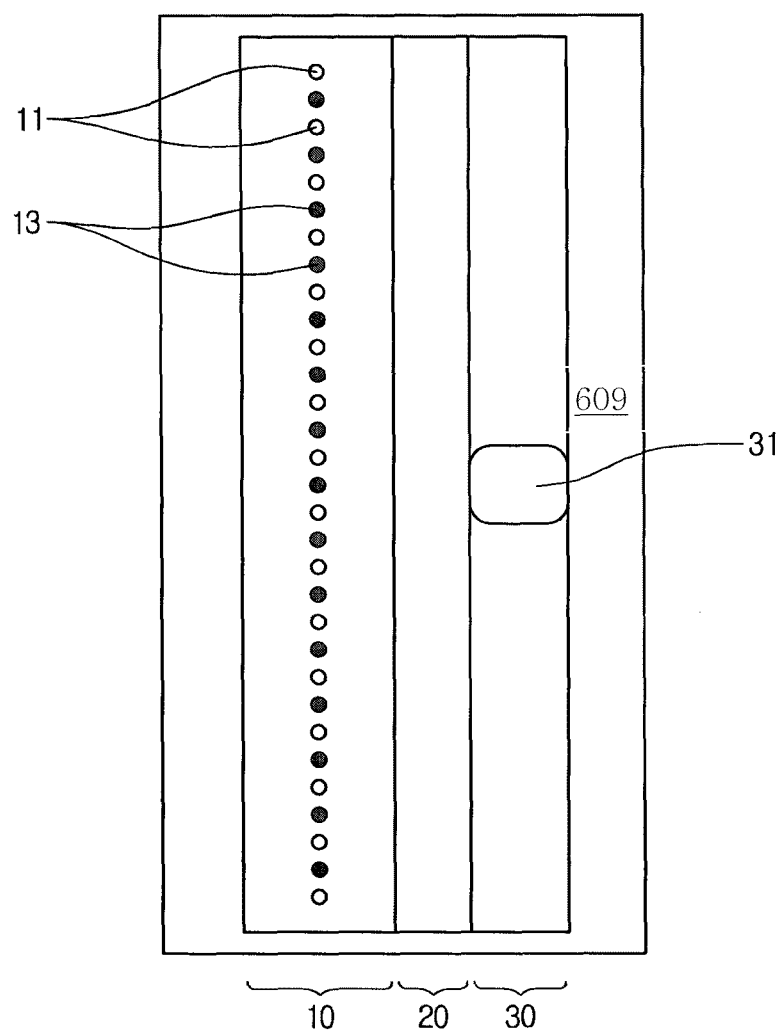
FIG. 13B is a bottom view of the vapor deposition reactor of FIG. 13A, according to one embodiment.

FIG. 13A is a sectional view of a vapor deposition reactor having a body 609 for injecting an inert gas together with a reacting material according to still another embodiment. FIG. 13B is a bottom view of the vapor deposition reactor of FIG. 13A. One or more injection portions 11 and one or more second injection portions 13 may be alternately arranged on one line perpendicular to the direction in which a substrate is moved.

FIG. 14 is a sectional view of a vapor deposition reactor for injecting an inert gas together with a reacting material according to still another embodiment. Referring to FIG. 14, the vapor deposition reactor may include a body 709 in which only one injection portion 11 and one channel 12 are formed. However, a transfer pipe 120 connected to the channel 12 to allow a material to be injected therethrough may be divided into two transfer pipes 121 and 122 different from each other by a valve $V_3$. The flow of the material in each of the transfer pipes 121 and 122 may be controlled by valves $V_1$ and $V_2$.

Figure 15B:
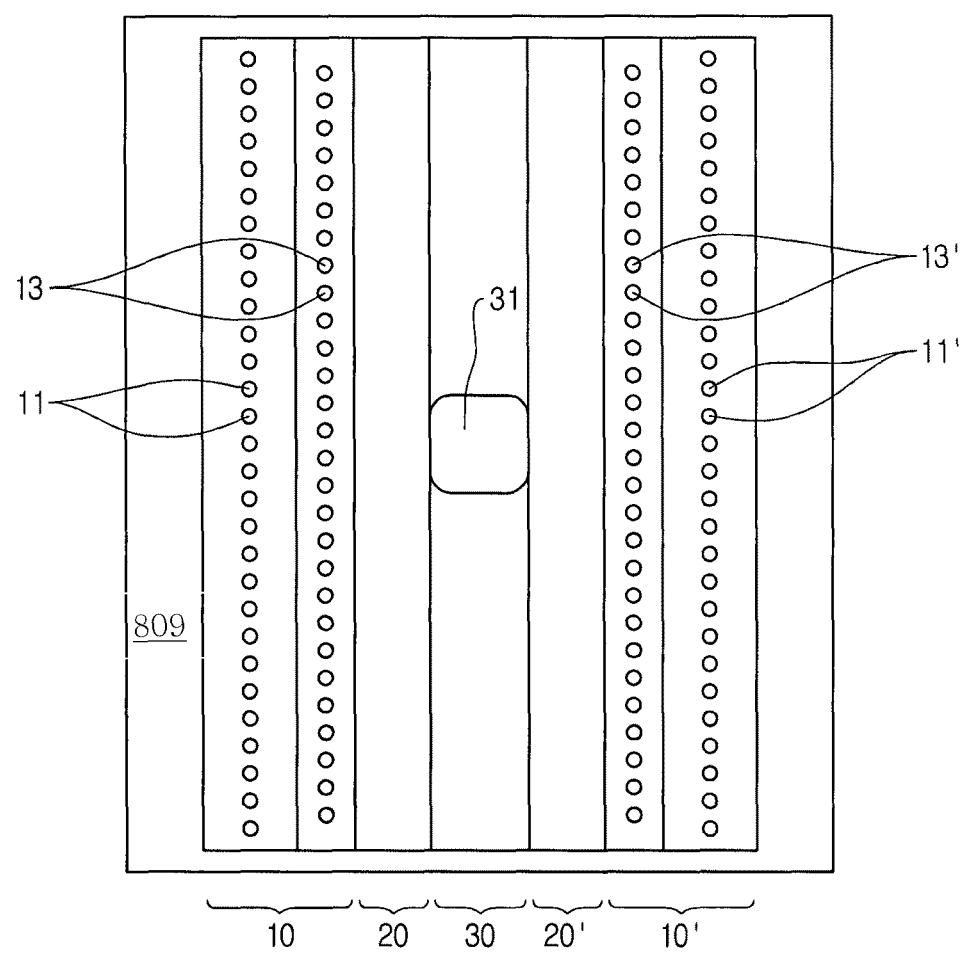
FIG. 15B is a bottom view of the vapor deposition reactor of FIG. 15A, according to one embodiment.

By using the vapor deposition reactor, the valves $V_1$ to $V_3$ are opened or closed so that two different materials (e.g., a reacting material and an inert gas) can be injected into the first portion 10 through the one injection portion 11 and the one channel 12. In this case, the reacting material and the inert gas can be simultaneously injected into the recess of the first portion 10 by simultaneously opening or closing the valves $V_1$ and $V_2$. Alternatively, the reacting material and the inert gas may be separately injected into the first portion 10 by alternately opening or closing the valves $V_1$ and $V_2$. Meanwhile, a plurality of first portions may be disposed in one vapor deposition reactor so that a source precursor and a reactant precursor are all injected onto a substrate in the one vapor deposition reactor. FIG. 15A is a sectional view of a vapor deposition reactor including a body 809 with a plurality of first portions according to still another embodiment. FIG. 15B is a bottom view of the vapor deposition reactor of FIG. 15A.

Referring to FIGS. 15A and 15B, the body 809 of the vapor deposition reactor may include two first portions 10 and 10', two second portions 20 and 20', and a third portion 30. The two second portions 20 and 20' may be disposed at both sides of the third portion 30, respectively. The two first portions 10 and 10' may be disposed at both outsides of the second portions 20 and 20', respectively. That is, the first portion 10, the second portion 20, the third portion 30, the second portion 20' and the first portion 10' are sequentially arranged in the vapor deposition reactor. Also, the third portion 30 is shared with the second portions 20 and 20' and the first portions 10 and 10' placed at different sides of the third portion 30.

First injection portions 11 and 11' may be formed in the respective first portions 10 and 10'. The first injection portions 11 and 11' may be connected to channels 12 and 12', respectively. A reacting material may be injected into the first portion 10 or 10' through the first injection portion 11 or 11'. By using the vapor deposition reactor having the two first portions 10 and 10' positioned in the vapor deposition reactor, the reacting material can be adsorbed twice on the substrate while a substrate passes by the one vapor deposition reactor.

As an example, a source precursor may be injected into the first portion 10, and a reactant precursor may be injected into the first portion 10'. While the substrate that passes by the vapor deposition reactor passes by the first portion 10, the source precursor is adsorbed on the substrate. While the substrate passes by the second portion 20, the third portion 30 and the second portion 20', a physisorbed layer of the source precursor is desorbed and exhausted. While the substrate passes by the first portion 10', the reactant precursor is reacted and/or replaced with the source precursor on the substrate, thereby forming an atomic-layer thin film. As described above, the formation of the atomic-layer thin film is described as an example. However, it will be apparent that chemical vapor deposition (CVD) may also be performed using the vapor deposition reactor.

Second injection portions 13 and 13' may be further formed in the respective first portions 10 and 10'. The second injection portions 13 and 13' may be connected to channels 14 and 14', respectively. An inert gas may be injected into the first portion 10 or 10' through the second injection portion 13 or 13'. When the inert gas is injected together with the source precursor or the reactant precursor, it functions to purge the physisorbed layer adsorbed on the substrate while the substrate passes by the second portion 20 and 20' and the third portion 30 so that the desorption is more effectively performed. Thus, the amount of the physisorbed layer on the substrate is less than that of the physisorbed layer on the substrate when only the source precursor or reactant precursor is injected. Accordingly, it is advantageous in formation of an atomic mono-layer.

Meanwhile, the reactant precursor physisorbed after forming the atomic-layer thin film remains on the substrate that passes by the vapor deposition reactor. Subsequently, if the substrate is passed through another vapor deposition reactor, the reactant precursor physisorbed on the substrate is reacted and/or replaced with a source precursor injected from the new vapor deposition reactor, thereby forming a thin film. Thus, the deposition velocity of the thin film can be increased. This is referred to as a pseudo-ALD mode.

Meanwhile, as another example, a source precursor (or reactant precursor) may be injected as a reacting material into the recess of the first portion 10, and only an inert gas may be injected into the recess of the first portion 10' with no reacting material. In this case, the reacting material is adsorbed on a substrate while the substrate passes by the first portion. While the substrate passes by the second portion 20, the third portion 30 and the second portion 20', the reacting material is desorbed and exhausted. The desorption of the reacting material is accelerated by the inert gas injected into the first portion 10', so that an adsorbed layer with a superior quality can be obtained. When an atomic-layer thin film is to be formed, an additional vapor deposition reactor is necessary for the purpose of the adsorbing the reactant precursor (or source precursor). However, an atomic-layer thin film with excellent characteristics can be formed.

The vapor deposition reactor shown in FIGS. 15A and 15B is configured so that two reactors are symmetrically arranged opposite to each other with a third portion interposed therebetween, on the basis of the shape of the vapor deposition reactor shown in FIGS. 10A and 10B. However, the vapor deposition is provided only for illustrative purposes. That is, the vapor deposition reactor may be configured so that two reactors are arranged based on the shapes of the aforementioned embodiments described with reference to FIGS. 1 to 14.

Figure 16A:
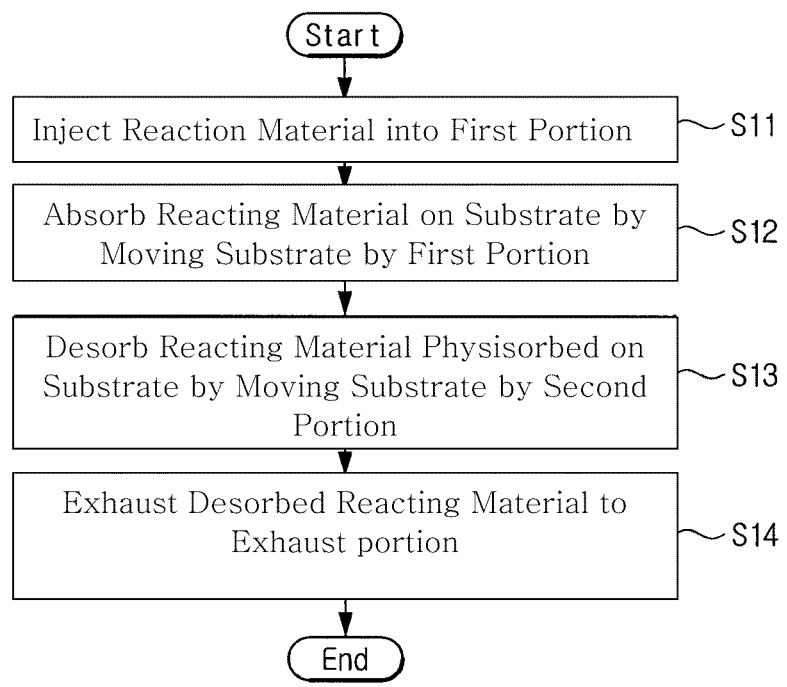
FIGS. 16A to 16C are flowcharts illustrating method for forming a thin film according to embodiments.

FIG. 16A is a flowchart illustrating a method for forming a thin film, according to an embodiment. A reacting material is injected S11 into a first portion of the vapor deposition reactor. For example, the reacting material may be a source precursor and/or reactant precursor. In an embodiment, an inert gas may be injected S11 together with the reacting material into the first portion in the process.

Subsequently, a substrate is moved S12 with respect to the first portion so that the reacting material is adsorbed on a surface of the substrate. At this time, chemisorbed and physisorbed layers of the reacting material are formed on the substrate. The relative movement of the substrate with respect to the first portion may be performed by moving the substrate to be adjacent to the vapor deposition reactor in the state that the vapor deposition reactor is fixed. Alternatively, the vapor deposition reactor may be moved in the state that the substrate is fixed.

Subsequently, the substrate is moved S13 with respect to a second portion so that the physisorbed layer of the reacting material is desorbed from the substrate. To this end, the pressure in the second portion may be lower than that in the first portion. Also, the desorption amount of the physisorbed layer may be adjusted by controlling the position, width and height of the second portion and/or the position of an adjustable wing in the second portion. The entire physisorbed layer may be removed from the substrate. Alternatively, the deposition velocity may be increased by allowing a part of the physisorbed layer to remain on the substrate.

Subsequently, the substrate is moved with respect to a third portion so that the desorbed reacting material is exhausted S14 to the exterior of the vapor deposition reactor through an exhaust portion. As a result, the reacting material physisorbed on the substrate can be at least partially removed. Through the aforementioned processes, a thin film including the chemisorbed layer of the reacting material can be formed on the substrate.

When the aforementioned processes S11 to S14 are repeatedly performed while exchanging the reacting material, e.g., when the aforementioned processes S11 to S14 are performed by alternately using the source precursor and the reactant precursor as the reacting material in process S11, an atomic-layer thin film can be formed on the substrate. Alternatively, the source precursor and the reactant precursor may be injected alternately into the first portion as the reacting material in the single process S11. As a result, an atomic layer thin film may be formed on the substrate when the aforementioned processes S11 to S14 are performed once. In this case, an inert gas may be injected as a purge gas after the injection of each of the source precursor and the reactant precursor.

Figure 16B:
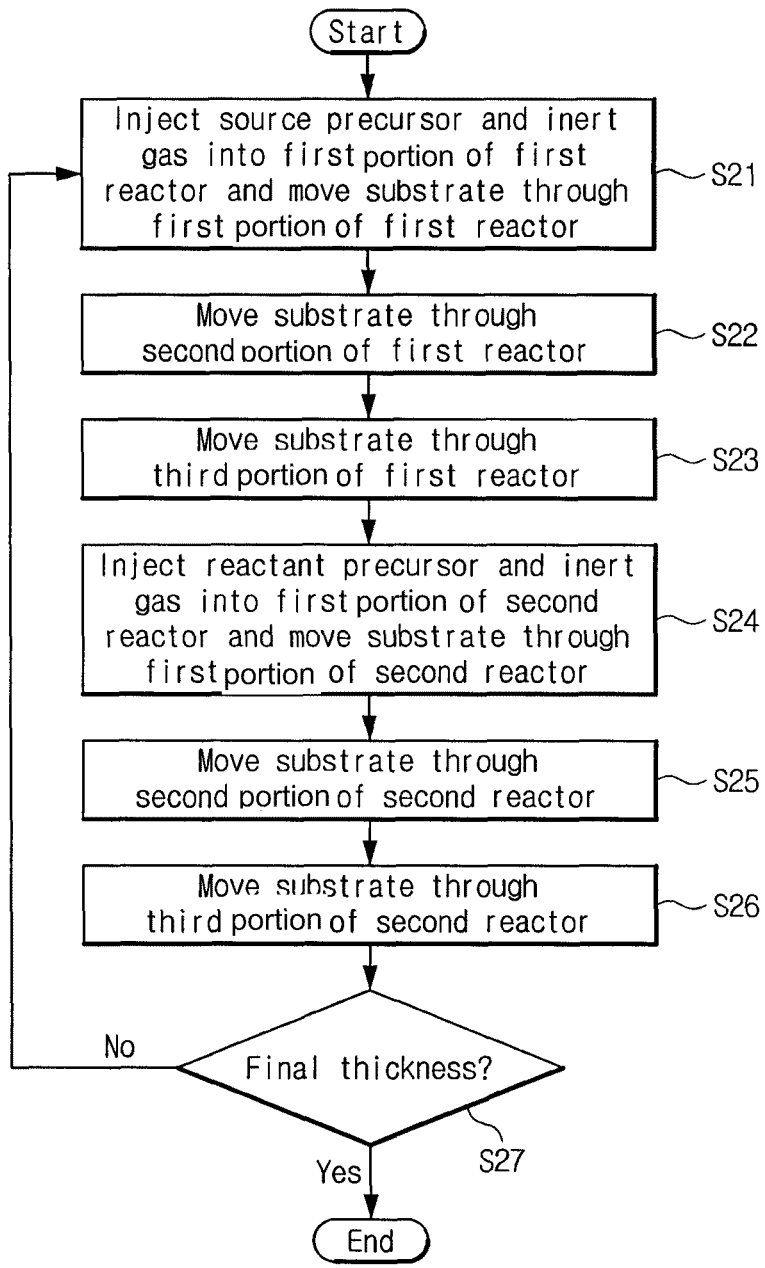

FIG. 16B is a flowchart illustrating a method for forming a thin film according to another embodiment. The method of FIG. 16B may be performed using two vapor deposition reactors. For example, the method may be performed using two vapor deposition reactors according to the embodiment described with reference to FIGS. 1 to 14.

Referring to FIG. 16B, a source precursor and an inert gas are injected into a first portion of a first reactor, and a substrate is moved S12 with respect to the first portion of the first reactor. As a result, the source precursor can be adsorbed on a surface of the substrate. Meanwhile, in another embodiment, only the source precursor may be injected S21 with no inert gas in the process.

The substrate is moved S22 with respect to a second portion of the first reactor. At this time, the pressure in the second portion may be lower than that in the first portion. Then, the substrate is move S23 with respect to a third portion of the first reactor. While the substrate passes by the second and third portions, a physisorbed layer of the source precursor adsorbed on the substrate is at least partially desorbed from the substrate and exhausted to the exterior of the first reactor.

A reactant precursor and an inert gas are injected into a first portion of a second reactor, and the substrate is moved S24 with respect to the first portion of the second reactor. As a result, the reactant precursor is adsorbed on the surface of the substrate, and the source precursor adsorbed on the substrate is reacted with the reactant precursor adsorbed on the substrate, thereby forming an atomic-layer thin film. Meanwhile, in another embodiment, only the reactant precursor may be injected S24 with no inert gas in the process.

The substrate is moved with respect to a second portion S25 of the second reactor (S25). At this time, the pressure in the second portion may be lower than that in the first portion. Then, the substrate is moved S26 with respect to a third portion of the second reactor. While the substrate passes by the second and third portions, a portion of the reactant precursor may be desorbed from the substrate and then exhausted to the exterior of the second reactor.

The aforementioned processes (S21 to S26) are performed until an atomic-layer thin film with a final thickness is formed S27, thereby forming an atomic-layer thin film with a desired thickness.

Figure 16C:
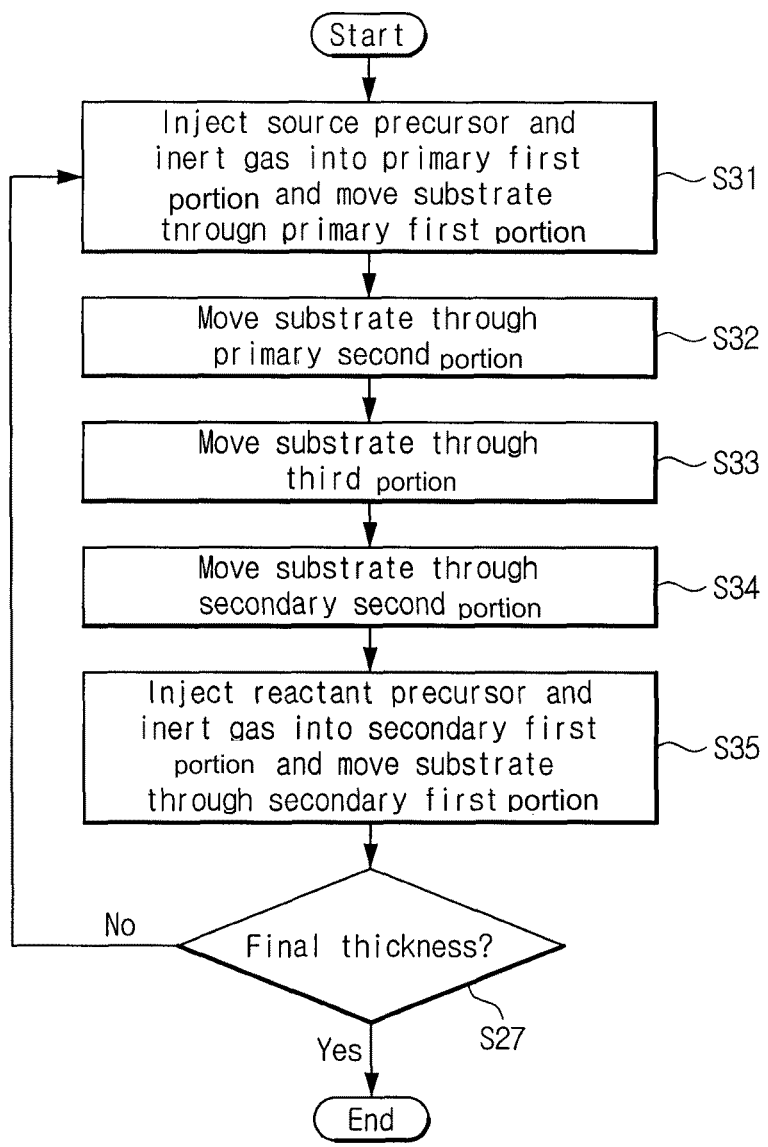

FIG. 16C is a flowchart illustrating a method for forming a thin film according to still another embodiment. The method of FIG. 16 may be performed using a vapor deposition reactor including two first portions. For example, the method may be performed using the vapor deposition reactor according to the embodiment described with reference to FIGS. 15A and 15B.

Referring to FIG. 16C, a source precursor and an inert gas are injected S31 into a primary first portion of the vapor deposition reactor, and a substrate is moved S31 with respect to the primary first portion. As a result, the source precursor can be adsorbed on a surface of the substrate. Meanwhile, in another embodiment, only the source precursor may be injected S31 with no inert gas in the process.

The substrate is moved S32 with respect to a primary second portion. At this time, the pressure in the second portion may be lower than that in the first portion. Then, the substrate is moved S33 with respect to a third portion. Then, the substrate is move S34 with respect to secondary second portion. While the substrate passes by the two second portions and the third portion, a physisorbed layer of the source precursor adsorbed on the substrate is at least partially desorbed and exhausted to the exterior of the vapor deposition reactor.

A reactant precursor and an inert gas are injected S35 into a secondary first portion of the vapor deposition reactor, and the substrate is moved S35 with respect to the secondary first portion. As a result, the reactant precursor is adsorbed on the surface of the substrate, and the source precursor adsorbed while the substrate passes by the primary first portion is reacted with the reactant precursor, thereby forming an atomic-layer thin film on the substrate. In another embodiment, only the reactant precursor may be injected S35 with no inert gas in the process.

The aforementioned processes (S31 to S35) are performed until an atomic-layer thin film with a final thickness is formed S36, thereby obtaining an atomic-layer thin film with a desired thickness.

Figure 17A:
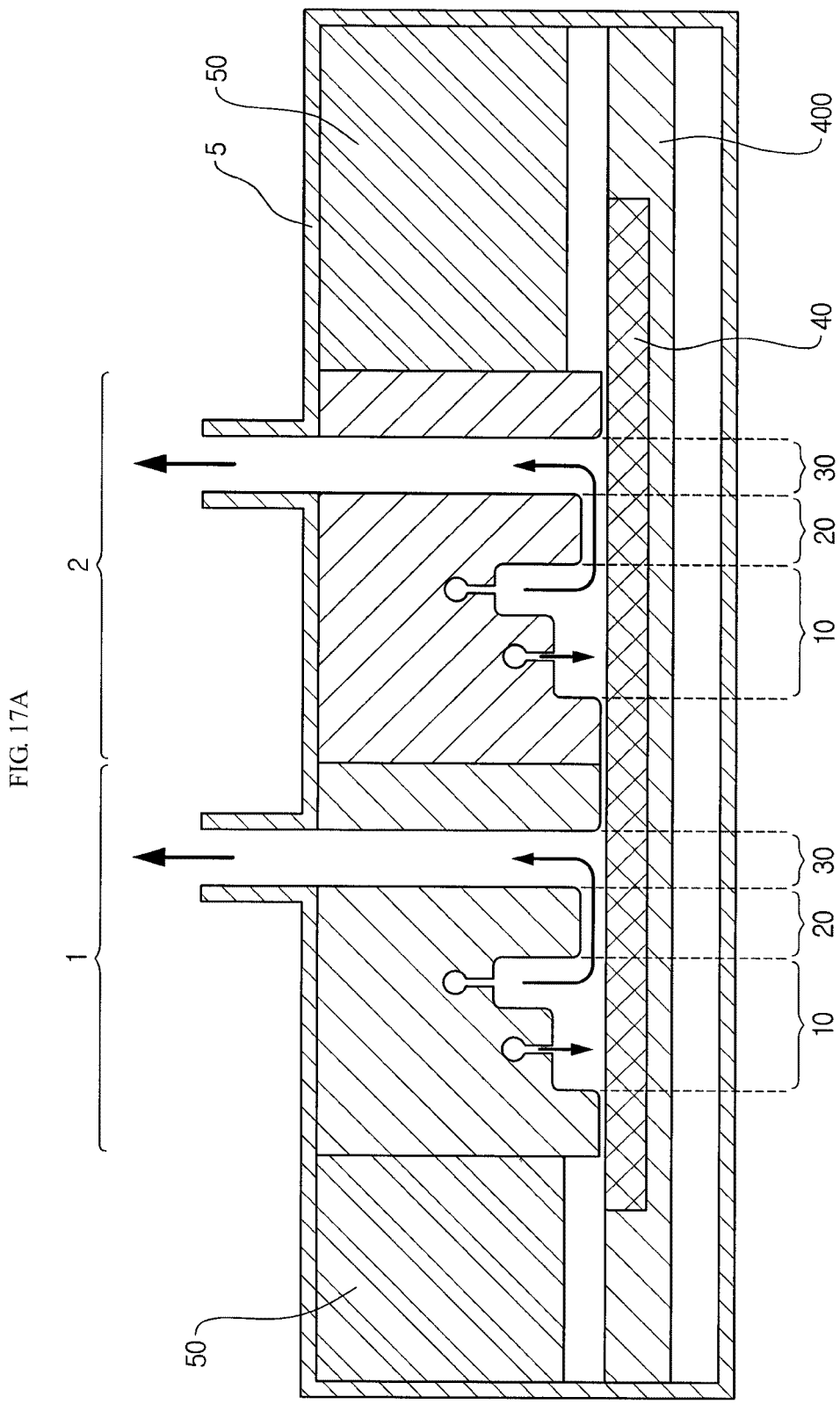
FIGS. 17A to 17E are exemplary sectional views of atomic layer deposition (ALD) equipments including vapor deposition reactors, according to embodiments.

FIG. 17A is a sectional view showing an example in which a vapor deposition reactor according to an embodiment is applied to an atomic layer deposition (ALD) equipment. The ALD equipment may be configured so that one or more vapor deposition reactors 1 and 2 each having a first, second and third portions 10, 20 and 30 are disposed in a chamber 5. A substrate 40 is supported by a susceptor 400, and is moved to pass through a lower portion of each of the vapor deposition reactors. The interior of the chamber 5 may be controlled to be in a vacuum state using a pump or the like. The interior of the chamber 50 may be filled with a filler 50 except for a region adjacent to the substrate 40. The filler 50 may be made of the same material as the outer wall of the chamber 5.

In the ALD equipment, a source precursor and an inert gas may be filled in a first portion of a first vapor deposition reactor 1. Also, a reactant precursor and an inert gas may be filled in a first portion 10 of a second vapor deposition reactor 2. As the substrate 40 passes by the first portion 10 of the first vapor deposition reactor 1, the source precursor may be adsorbed on the substrate 40. Subsequently, as the substrate 40 passes by second and third portions 20 and 30 of the first vapor deposition reactor 1, pressure is lowered. Thus, a physisorbed layer of the source precursor adsorbed on the substrate 40 is desorbed from the substrate 40 and exhausted to the exterior of the first vapor deposition reactor 1.

Subsequently, as the substrate passes by the first portion 10 of the second vapor deposition reactor 2, the reactant precursor may be adsorbed on the substrate 40. The reactant precursor is reacted with the source precursor adsorbed on the substrate, thereby forming an atomic-layer thin film. Subsequently, as the substrate 40 passes by second and third portions 20 and 30 of the second vapor deposition reactor 2, the reactant precursor is at least partially desorbed from the substrate 40 and exhausted to the exterior of the second vapor deposition reactor 2. At this time, the source precursor and the reactant precursor are injected into and exhausted from the first and second vapor deposition reactors 1 and 2, respectively. Therefore, the source precursor and the reactant precursor do not come in contact with each other. Thus, it is possible to minimize a reactant byproduct such as powder or gum or reactant product generated in an exhaust pipe.

Figure 17B:
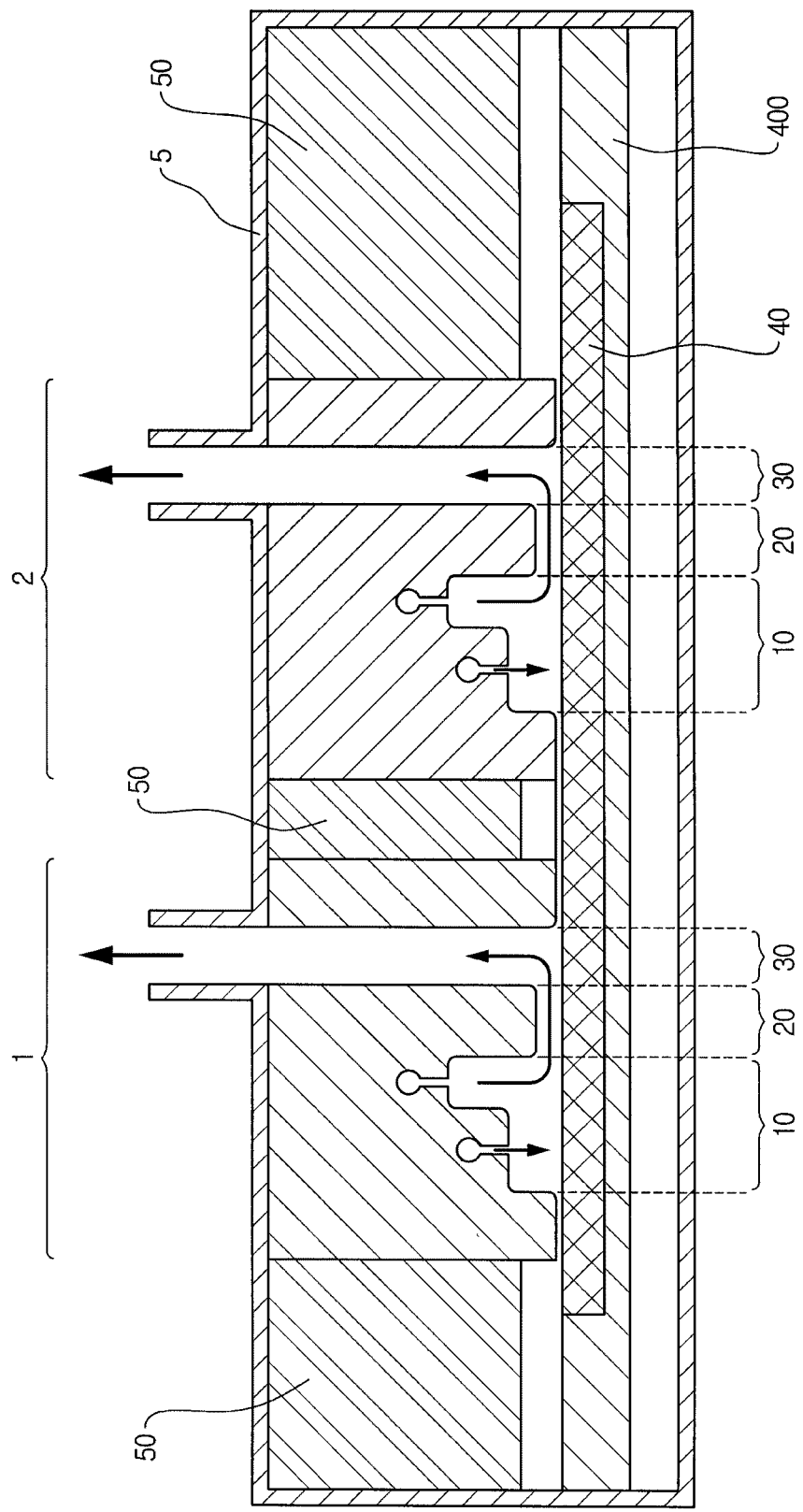

FIG. 17B is a sectional view showing an example in which a vapor deposition reactor according to another embodiment is applied to the ALD equipment. The vapor deposition reactor is similar to that shown in FIG. 17A, but the first and second vapor deposition reactors 1 and 2 are spaced apart from each other at a predetermined interval by the filler 50. Thus, it is possible to minimize mixing of the source precursor injected into the first vapor deposition reactor 1 with the reactant precursor injected into the second vapor deposition reactor 2. At this time, the interval between the first and second vapor deposition reactors 1 and 2 may be appropriately determined based on the interval between the substrate 40 and the first and second vapor deposition reactors 1 and 2, the performance of a pump (not shown) for pumping the chamber 5, the characteristics of the source precursor and the reactant precursor, and/or the like.

Figure 17C:
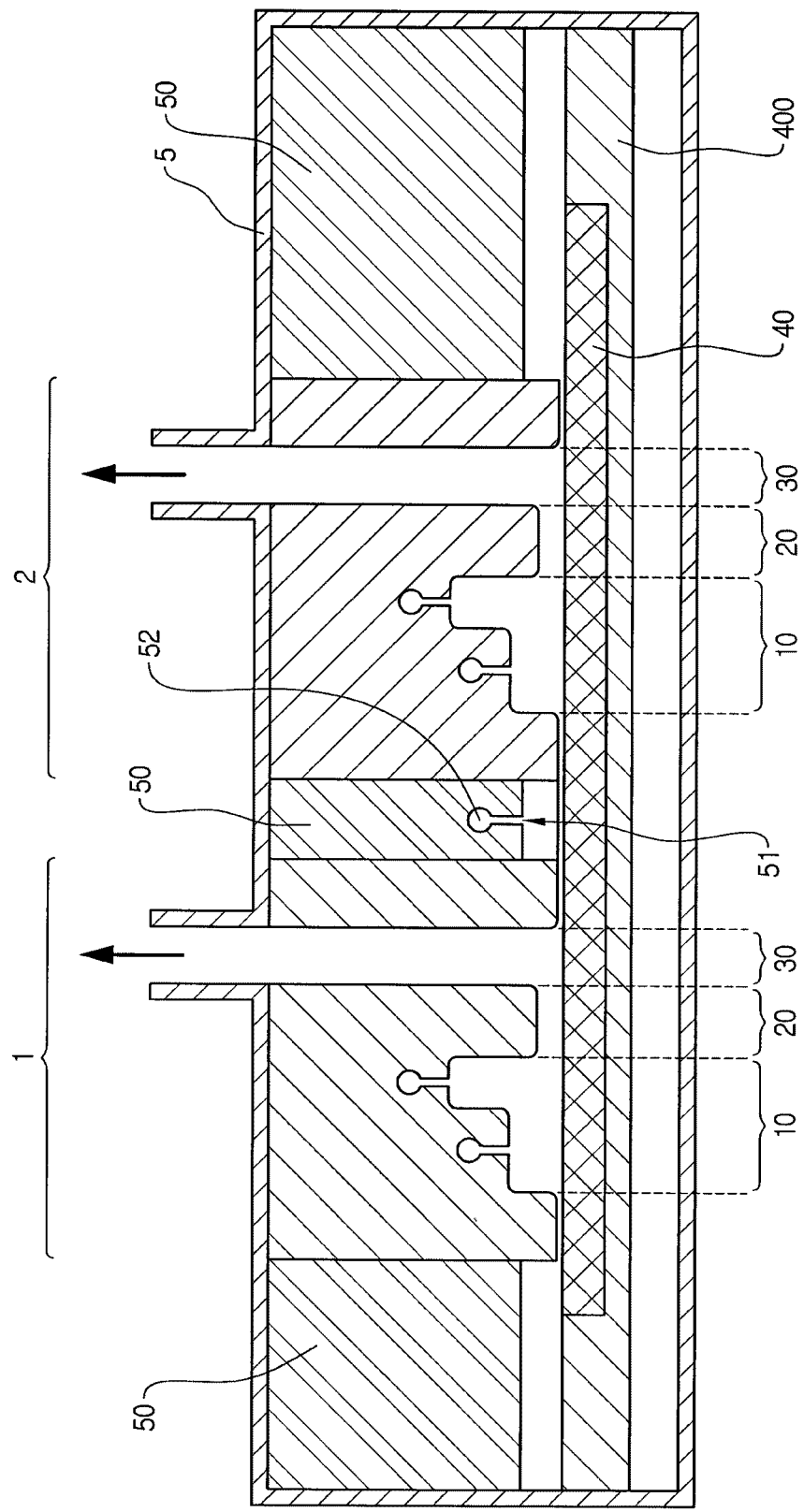

FIG. 17C is a sectional view showing an example in which a vapor deposition reactor according to still another embodiment is applied to the ALD equipment. Referring to FIG. 17C, the vapor deposition reactor is similar to that shown in FIG. 17B, but one or more injection portions 51 and a channel 52 connected to the injection portions 51 are formed in the filler 50 between the first and second vapor deposition reactors 1 and 2. An inert gas may be injected through the channel 52 and the injection portions 51. The possibility that gas is to be mixed between the first and second vapor deposition reactors 1 and 2 can be more reduced by the inert gas.

Figure 17D:
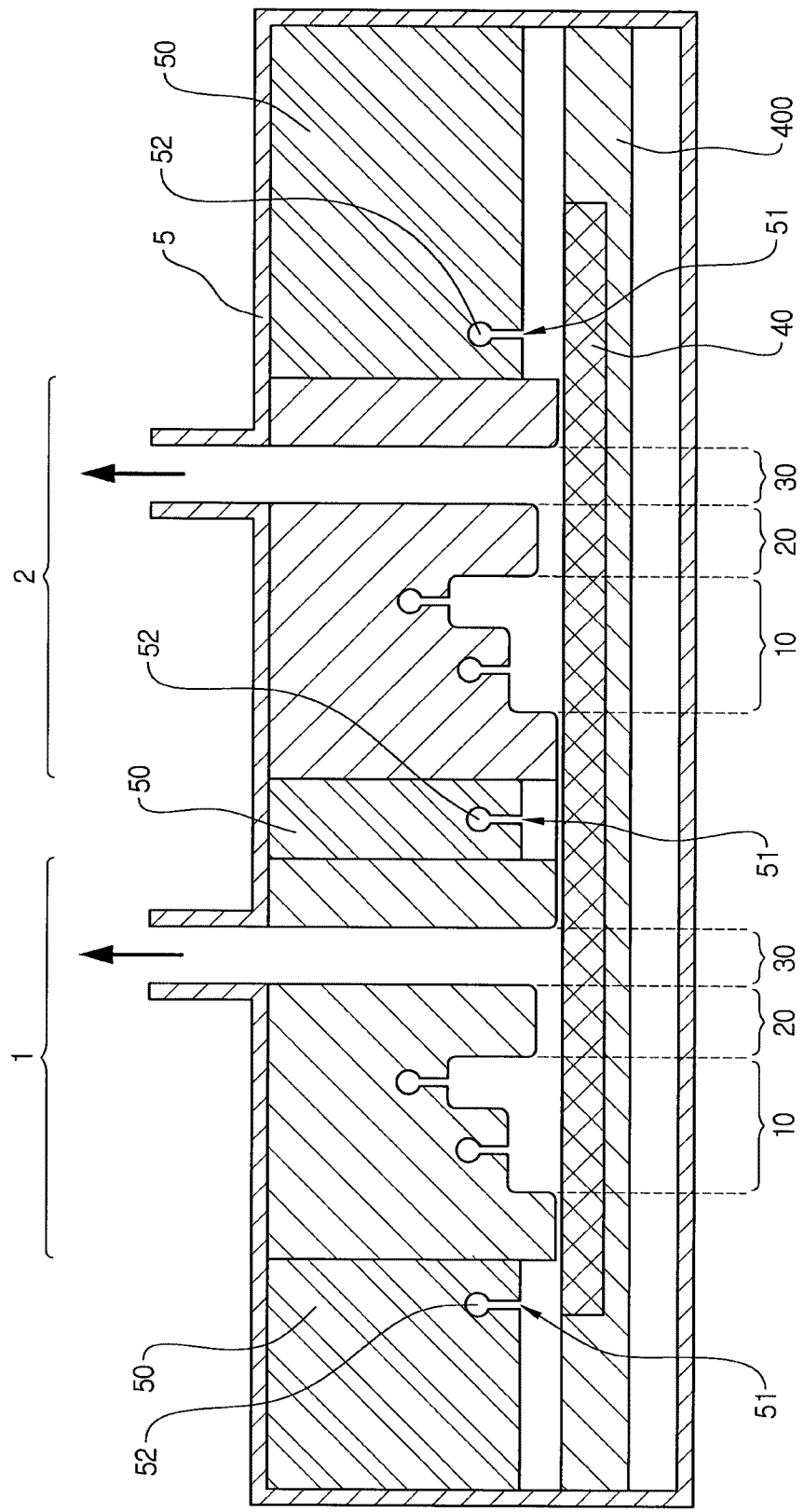

FIG. 17D is a sectional view showing an example in which a vapor deposition reactor according to still another embodiment is applied to the ALD equipment. Referring to FIG. 17D, the vapor deposition reactor is similar to that shown in FIG. 17C, but injection portions 51 and a channels 52 for injecting the inert gas are formed not only between the first and second vapor deposition reactors 1 and 2 but also at outsides of the first and second vapor deposition reactors 1 and 2.

In the ALD equipment shown in FIGS. 17C and 17D, the interior of the chamber 5 is pumped by a separate pump (not shown). Therefore, the inert gas injected through the injection portions 51 may be controlled to have a higher pressure than that the pressure in the first portion 10 of each of the first and second vapor deposition reactors 1 and 2. As a result, the pressure around the first and second vapor deposition reactors 1 and 2 may be higher than that in the first portion 10 of the first and second vapor deposition reactors 1 and 2. Accordingly, leaking of the source precursor and the reactant precursor to the exterior of the first and second vapor deposition reactors 1 and 2 can be minimized.

The ALD equipment using the vapor deposition reactor shown in FIGS. 10A and 10B as each of the first and second vapor deposition reactors 1 and 2 has been shown in FIGS. 17A to 17D. However, the ALD equipment is provided only for illustrative purposes. That is, the ALD equipment may be configured using a vapor deposition reactor according to other embodiments. As an example, the ALD equipment may be configured using a vapor deposition reactor including two first portions.

Figure 17E:
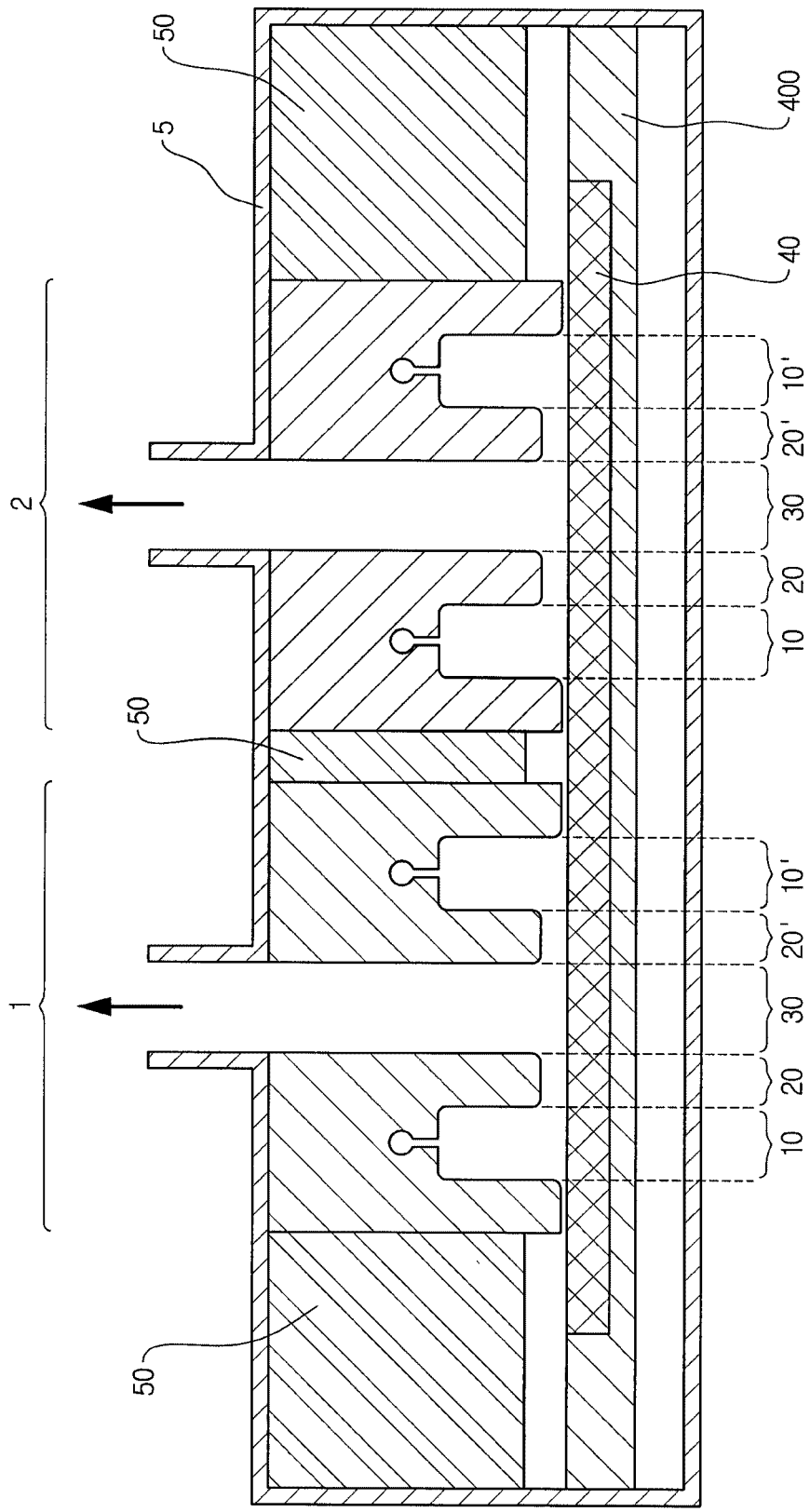

FIG. 17E is a sectional view of an ALD equipment configured using a vapor deposition reactor including two first portions. In the ALD equipment, each of the first and second vapor deposition reactors 1 and 2 may include two first portions 10 and 10', two second portions 20 and 20' and a third portion 30. In the ALD equipment configured as described above, a source precursor may be injected into a primary first portion 10 of the first vapor deposition reactor 1, and an inert gas may be injected into a secondary first portion 10' of the first vapor deposition reactor 1. A reactant precursor may be injected into a primary first portion 10 of the second vapor deposition reactor 2, and an inert gas may be injected into a secondary first portion 10' of the second vapor deposition reactor 2.

While a substrate 40 passes by the first vapor deposition reactor 1, the following processes are performed. First, while the substrate 40 passes by the primary first portion 10, the source precursor may be adsorbed on the substrate. While the substrate 40 passes by the primary second portion 20 and the third portion 30, a physisorbed layer of the source precursor may be desorbed and exhausted. Subsequently, while the substrate 40 passes by the secondary second portion 20', the inert gas injected into the secondary first portion 10' passes by the secondary second portion 20'. Therefore, pressure is lowered, and accordingly, additional desorption occurs. Through the aforementioned processes, only a pure chemisorbed layer can remain on the substrate 40 that passes by the first vapor deposition reactor 1.

Processes performed while the substrate 40 passes by the second vapor deposition reactor 2 are performed similarly to those performed while the substrate passes by the first vapor deposition reactor 1. However, the second vapor deposition reactor 2 is different from the first vapor deposition reactor 1 in that the reactant precursor is injected into the primary first portion 10 of the second vapor deposition reactor 2. The reactant precursor is reacted with a chemisorbed layer of the source precursor adsorbed on the substrate 40, so that an atomic-layer thin film of a mono molecular-layer can be formed on the substrate that passes by all of the first and second vapor deposition reactors 1 and 2.

As described above, the shape of the vapor deposition reactors included in the ALD equipments described with reference to FIGS. 17A to 17E is provided only for illustrative purposes. That is, it will be readily understood by those skilled in the art the ALD equipments may be configured using vapor deposition reactors according to other embodiments described in this disclosure or various modifications that are not described herein.

Figure 18A:
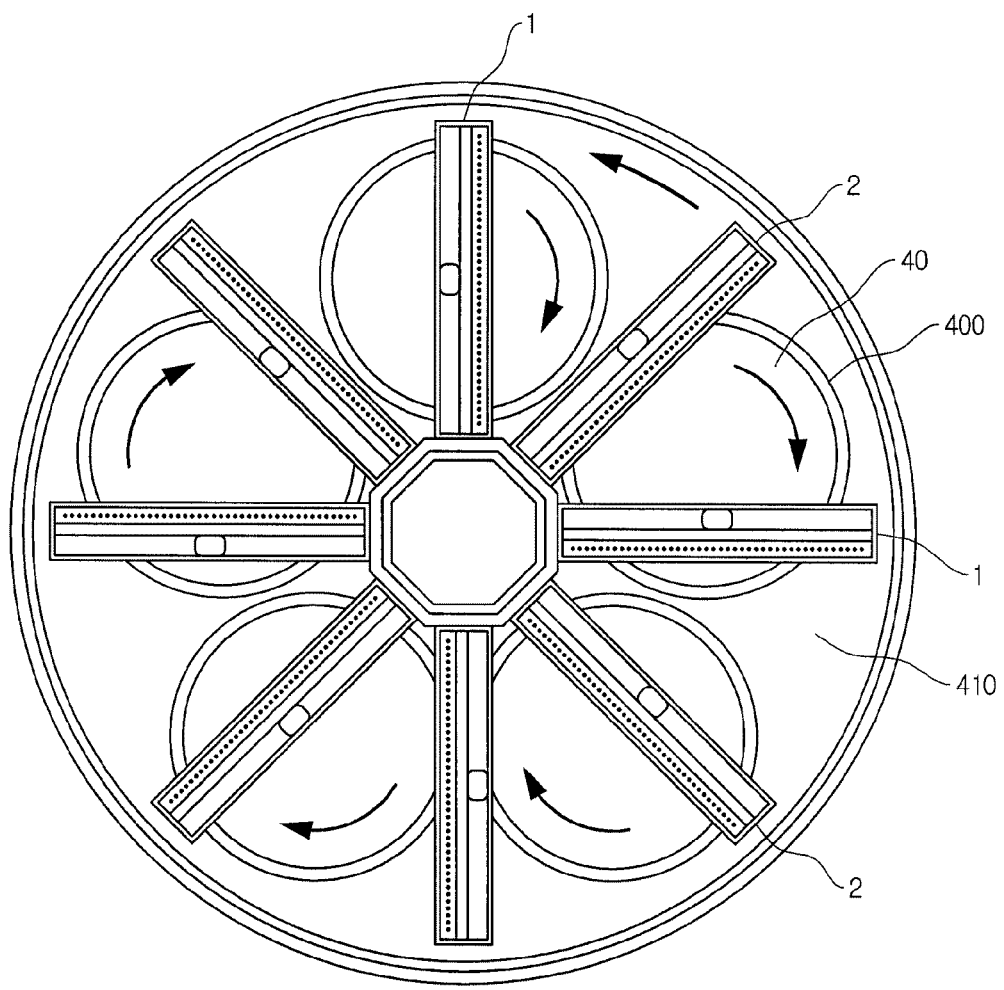
FIGS. 18A to 18D are exemplary plan views of ALD equipments including vapor deposition reactors, according to embodiments.

FIG. 18A is a plan view of an ALD equipment including vapor deposition reactors according to an embodiment. Referring to FIG. 18A, in the ALD equipment, a substrate 40 may be supported by a susceptor 400 and disposed on a rotating table 410 to be rotatably moved. First and second vapor deposition reactors 1 and 2 are disposed on the rotating table 410. The first and second vapor deposition reactors 1 and 2 may be disposed so that as the rotating table 410 is rotated, the substrate 40 sequentially passes by lower portions of the first and second vapor deposition reactors 1 and 2. The number and shape of the first and second vapor deposition reactors 1 and 2 are provided only for illustrative purposes. The shape and/or number of the vapor deposition reactors 1 and 2 may be appropriately controlled based on the characteristics of a thin film to be formed.

Figure 18B:
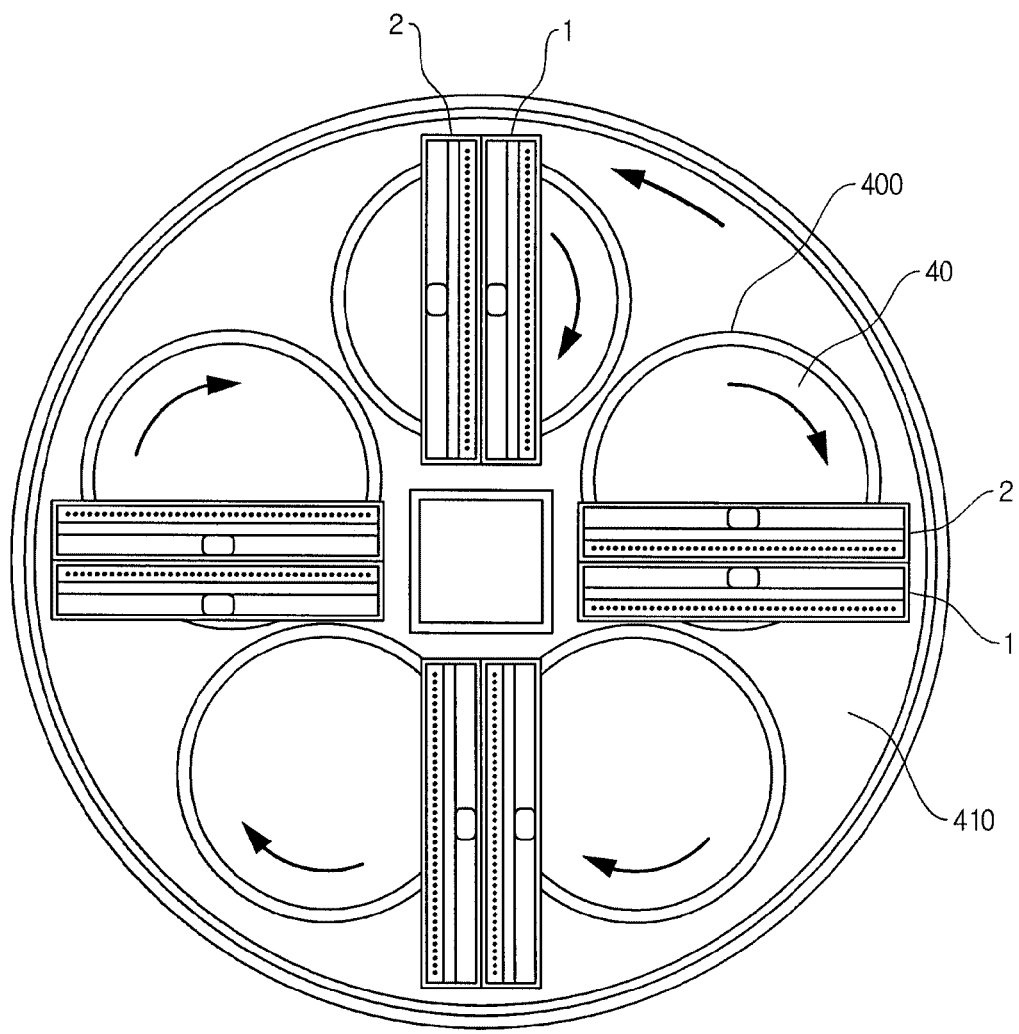

FIG. 18B is a plan view of an ALD equipment including vapor deposition reactors according to another embodiment. Referring to FIG. 18B, a pair of first and second vapor deposition reactors 1 and 2 is configured, and one or more pairs of the first and second vapor deposition reactors 1 and 2 may be arranged. Whenever a substrate 40 passes by a lower portion of each of the pairs of the first and second vapor deposition reactors 1 and 2, a one-layer of thin film can be formed.

Figure 18C:
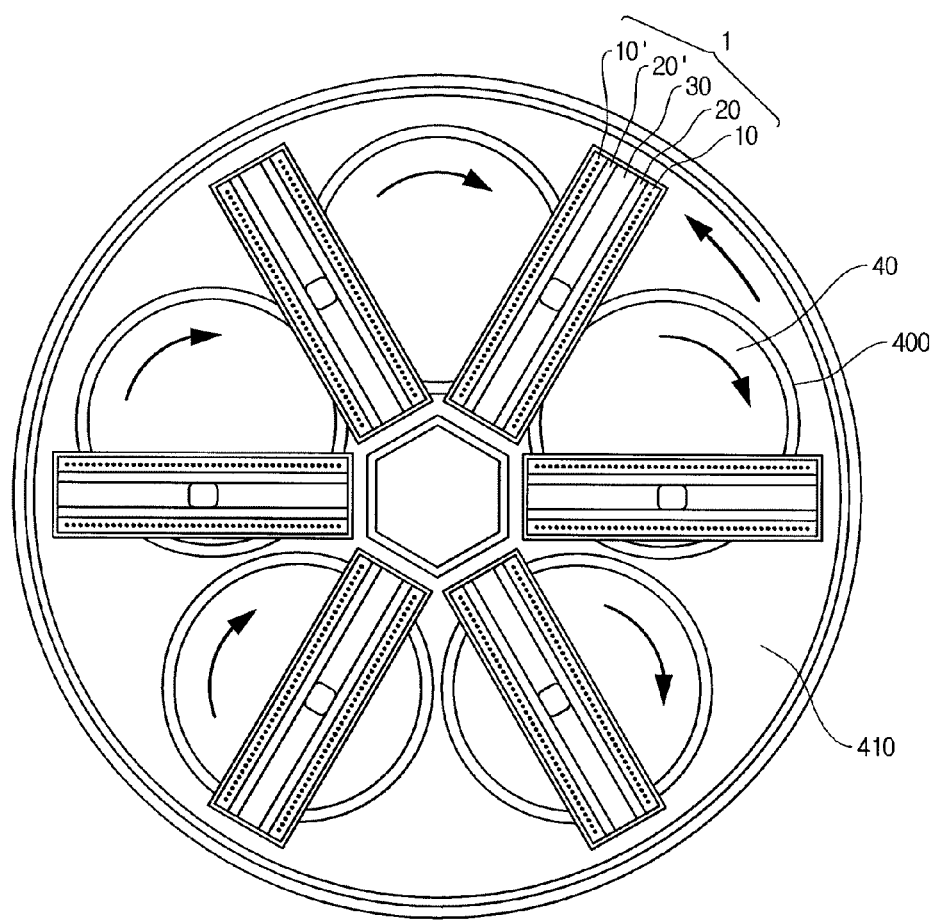

FIG. 18C is a plan view of an ALD equipment including vapor deposition reactors according to still another embodiment. Referring to FIG. 18C, the ALD equipment may be configured using vapor deposition reactors each including two first portions 10 and 10', two second portions 20 and 20' and a third portion 30. A source precursor and a reactant precursor are injected the two first portions 10 and 10', respectively, so that a one-layer atomic-layer thin film can be formed on a substrate 40 whenever the substrate 40 passes by each of the vapor deposition reactors 1. Alternatively, a source precursor and an inert gas may be injected into the two first portions 10 and 10' of one vapor deposition reactor 1, respectively, and a reactant precursor and an inert gas may be injected into the two first portions 10 and 10' of a subsequent vapor deposition reactor 1.

In the embodiments described with reference to FIGS. 18A to 18C, the rotating table 410 is rotated, and therefore, the angular velocity of the substrate 40 moved at the inside of the rotating table 410 is different from that of the substrate 40 moved at the outside of the rotating table 410. As a result, the thickness and/or characteristic of a thin film formed on the substrate 40 that passes by the vapor deposition reactors 1 and 2 may not be uniform. To solve such a problem, the susceptor 400 is rotated separately from the rotation of the rotating table 410, so that the substrate 40 can pass through the lower portions of the vapor deposition reactors 1 and 2 while being rotated. For example, the substrate 40 may be rotated once while passing through one of the vapor deposition reactors 1 and 2. However, the rotation velocity of the substrate is not limited thereto, but may be properly controlled based on the characteristics of the thin film, and the like.

Figure 18D:
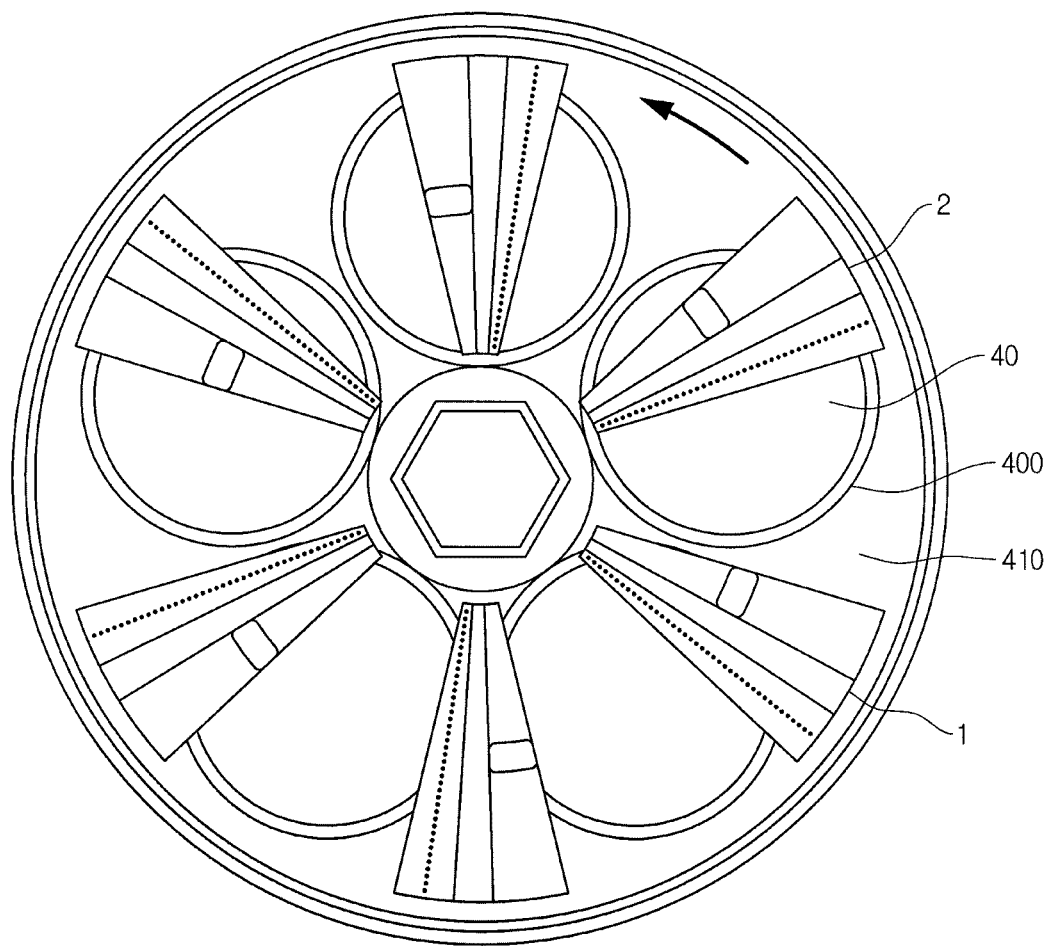

Meanwhile, the problem that the movement velocities of the substrate 40, respectively rotated at the inside and outside of the rotating table 410, are different from each other may be solved by modifying the shape of the vapor deposition reactor. FIG. 18D is a plan view of an ALD equipment including vapor deposition reactors according to still another embodiment. Referring to FIG. 18D, since the movement velocities of the substrate 40, respectively rotated at the inside and outside of the rotating table 410, are different from each other, the vapor deposition reactor 1 may be configured to have a fan shape of which width is relatively narrow at the inside of the rotating table 410 and is relatively wide at the outside of the rotating table 410. Through the configuration describe above, it is unnecessary to rotate the susceptor 400.

Example of Forming TiN Thin Film Using Vapor Deposition Reactor

Figure 19:
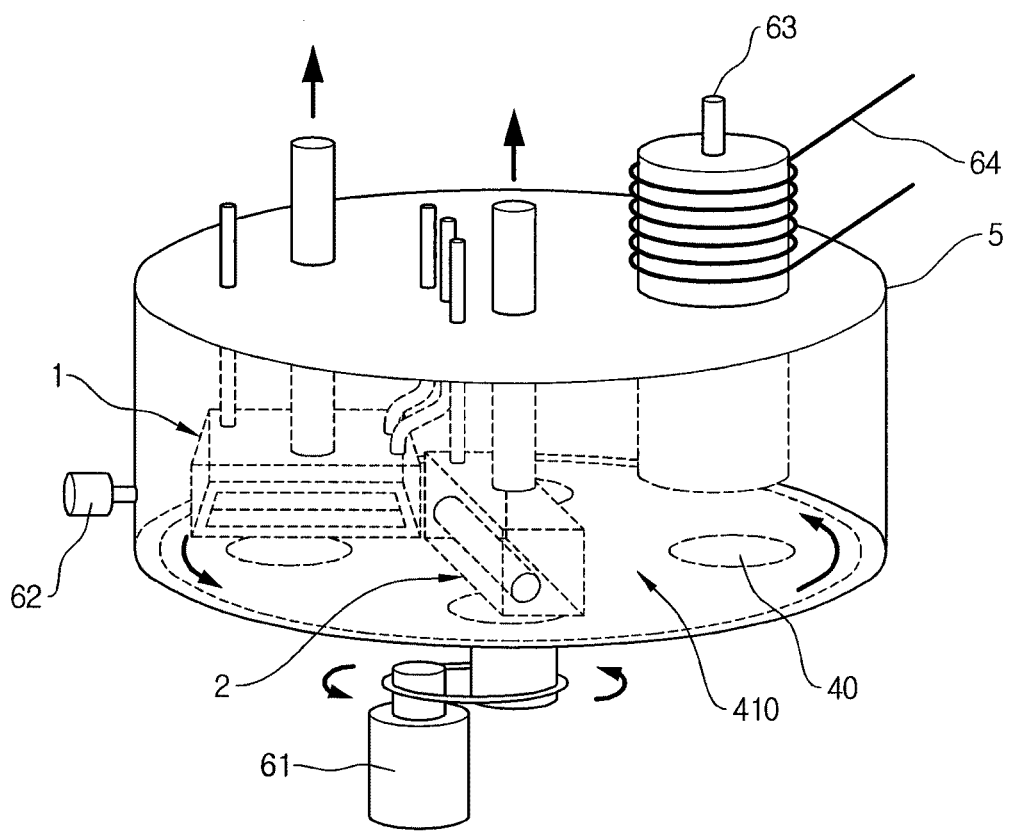
FIG. 19 is a schematic view of an experimental apparatus using a vapor deposition reactor, according to one embodiment.
Figure 20:
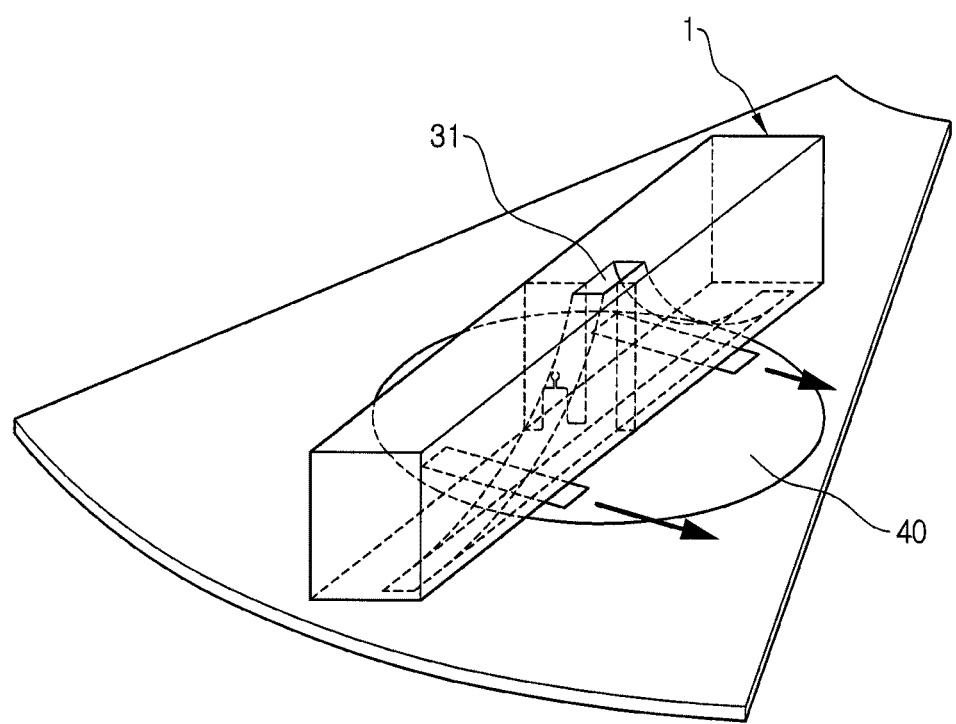
FIG. 20 is a schematic perspective view of a portion of the vapor deposition reactor in the experimental apparatus of FIG. 19, according to one embodiment.
Figure 21A:
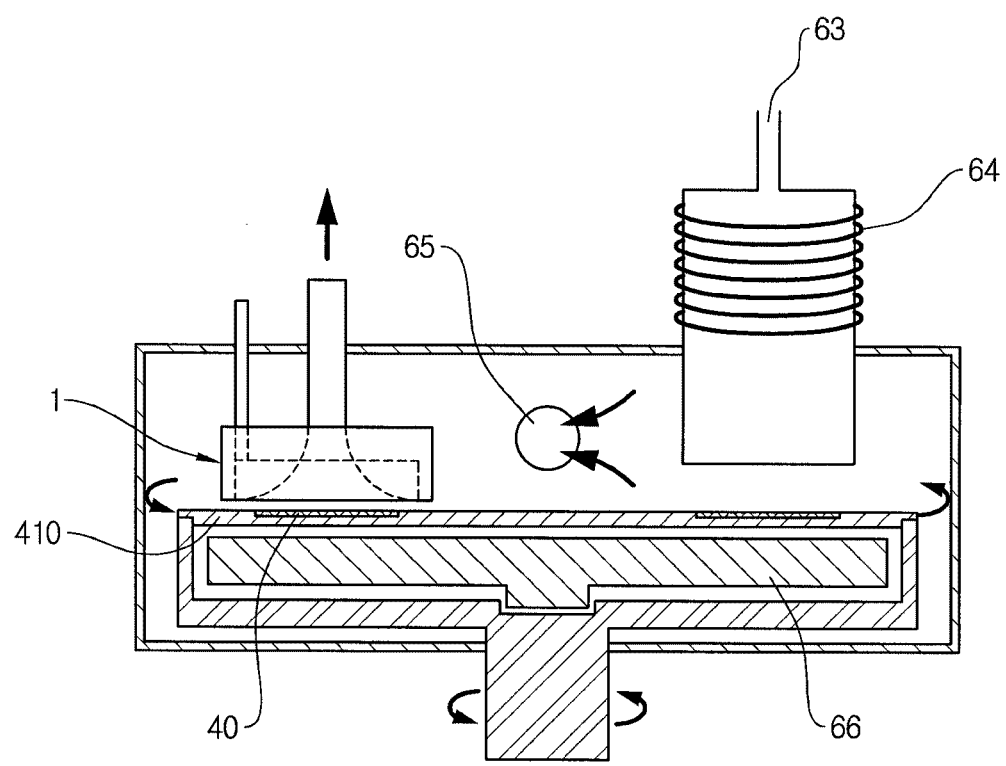
FIG. 21A is a schematic sectional view of the experimental apparatus of FIG. 19, according to one embodiment.

FIG. 19 is a schematic view of an experimental apparatus for forming a TiN atomic-layer thin film using a vapor deposition reactor, according to an embodiment. FIG. 20 is a schematic perspective view of a portion of the vapor deposition reactor in the experimental apparatus of FIG. 19, according to one embodiment. FIG. 21A is a schematic sectional view of the experimental apparatus of FIG. 19. FIG. 21B is a schematic sectional view of a coaxial capacitive plasma generator, according to one embodiment.

Referring to FIGS. 19 to 21B, the experimental apparatus may include a rotating susceptor 410 in which recesses are formed in a depth of 0.5 mm so that two 2-inch substrates and two 3-inch substrates can be positioned in the recesses, respectively. The substrates supported by the rotating susceptor 410 may be indirectly heated a metal heater 66 installed at a lower portion of the rotating susceptor 410. A chamber 5 may include a hole 65 for vacuum pumping, which may be connected to an exhaust pipe with a diameter of 40 mm. An exhaust portion 31 of a vapor deposition reactor 1 may be connected to an exhaust pipe with a diameter of 20 mm for the purpose of pumping. At this time, a throttle valve (not shown) may be installed in the exhaust pipe of the chamber 5 or the vapor deposition reactor 1 so as to control its exhaust velocity. The vacuum degree of the chamber 5 may be measured by a vacuum gauge 62, and the rotation velocity of the rotating susceptor 410 may be decelerated by 10:1 to about 18 rpm as compared with that of a motor 61.

The experimental apparatus may further include a quartz tube 63 and a coil 64 so as to apply ICP (inductive coupled plasma) type remote-plasma. A radio frequency (RF) voltage of about 5 to 100 watt may be applied to the coil 64 so as to generate $NH_3$ plasma. However, in another embodiment, a TiN atomic-layer thin film may be formed by a simple thermal reaction without generating plasma. At this time, in the experimental apparatus, an additional vapor deposition reactor may be installed in the portion in which the quartz tube 63 and the coil 64 are to be installed, and $NH_3$ may be injected as a reactant precursor into the additional vapor deposition reactor. TiCl4 may be supplied as a source precursor to the vapor deposition reactor 1 using an Ar bubbling method. In the vapor deposition reactor, the deposition efficiency, i.e., the ratio of the source precursor used in the formation of a thin film with respect to the source precursor supplied, is high, and hence, $TiCl_4$ is supplied from a canister which is cooled down to about −4° C.

The height of a first portion of the vapor deposition reactor 1 is about 20 mm, the width of the first portion is about 10 mm, and the length of the first portion is about 100 mm. The width of a third portion of the vapor deposition reactor 1 is about 16 mm. From the results obtained in Tables 1, 2 and 3, the vapor deposition reactor 1 may be configured so that the height of a second portion is about 2 mm and the width of the second portion is about 4 mm. When the substrate 40 passes by a lower portion of the vapor deposition reactor 1, the time at which the substrate 40 is exposed to the first portion is about 105 msec at an inside of the substrate 40 close to the center of the rotating table 410 when the rotation velocity of the rotating table 410 is about 10 rpm, and the time is about 60 msec when the rotation velocity of the rotating table 410 is about 18 rpm. Meanwhile, the angular velocity of an outside of the substrate 40 distant from the center of the rotating table 410 is greater than that of the inside of the substrate 40. As a result, when the rotation velocity of the rotating table 410 is about 10 rpm and about 18 rpm, the times at which the outside of the substrate 40 is exposed to the first portion are about 80 msec and about 44 msec, respectively.

The time at which the inside of the substrate 40 passes by the second and third portions is about 210 msec when the rotation velocity of the rotating table 410 is about 10 rmp, and the time is about 120 msec when the rotation velocity of the rotating table 410 is about 18 rpm. Also, the time at which the inside of the substrate 40 completely passes by the vapor deposition reactor 1 is about 315 msec when the rotation velocity of the rotating table 410 is about 10 rmp, and the time is about 180 msec when the rotation velocity of the rotating table 410 is about 18 rpm.

The experimental apparatus may further include a coaxial remote plasma generator 2 as illustrated in FIG. 21B. The plasma generator 2 includes a body 2100 and valves Va, Vb and Vc for transporting and controlling rates of materials for generating plasma 1200. A voltage of 500V to 1500V is applied across the electrodes 12A and 12B in a first portion 10 to generate plasma 1200. The generated plasma 2100 is provided through an injector 1100 in the form of slits. In one embodiment, the slits have widths not smaller than 2 mm. In one embodiment, the distance between the substrate and the upper end of the injector 1100 is preferably 15 to 20 mm. The diameter of the cylindrical space holding the plasma 1200 is 10 mm to 20 mm. In one embodiment the distance between the substrate and the injector is 12 mm.

In one embodiment, reactant gas such as $O_2$, $H_2$ or $NH_3$ is provided via pipes 2202, 2204, 2206 and valves Va, Vb and Vc to the cylindrical space. By applying voltage across the electrodes 12A and 12B in the presence of the reactance gas, the coaxial capacitive plasma is generated. The top surface of the substrate is exposed to O* radical, N* radical or H* radicals obtained from the coaxial capacitive plasma to form an ALD layer. Remaining O* radical, N* radical or H* radicals are discharged via a second portion 20, a third portion 30 and an exhaust portion 310.

Meanwhile, the experimental apparatus may include a halogen lamp (not shown) installed between the vapor deposition reactors 1 or at the last position of the substrate 40 so that additional thermal treatment can be performed during or after a thin film is deposited. In addition, before an atomic-layer thin film is deposited, cleaning or removing of a natural oxide film may be performed with respect to the substrate 40. In this case, a gas for removing an oxide film, such as $ClF_3$ or $NF_3$, may be injected into the vapor deposition reactor 1, or hydrogen remote-plasma may be generated in the vapor deposition reactor 1. Thus, the atomic layer thin film may be deposited through in-situ by performing a surface treatment or pre-processing process before the atomic layer thin film is deposited. Alternatively, after the natural oxide thin film is removed, nitriding may be performed with respect to the substrate using nitrogen radical by nitrogen remote-plasma. Then, a high-k thin film may be deposited through in-situ.

Figure 22A:
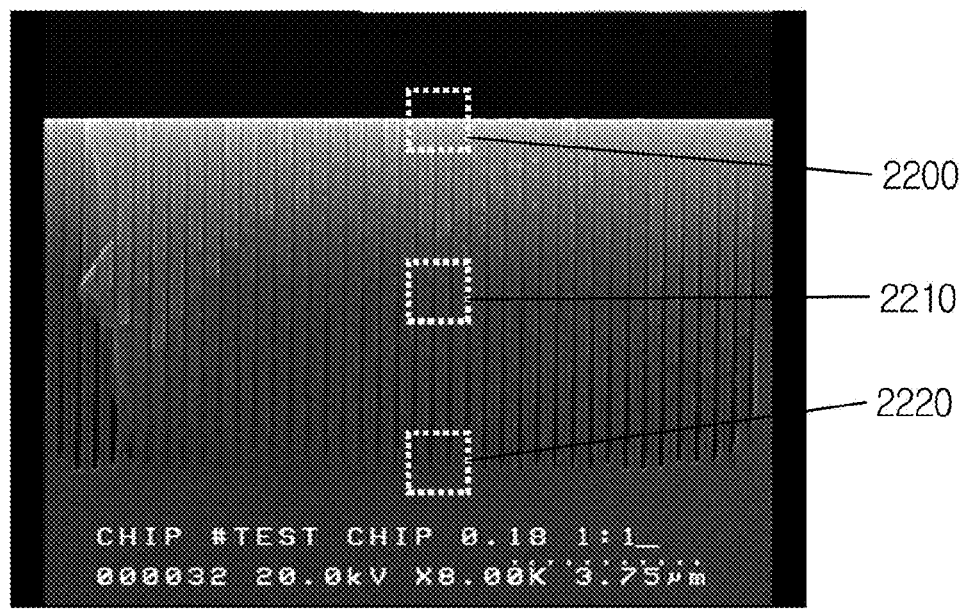
FIGS. 22A to 22D are scanning electron microscope (SEM) photographs of a TiN thin film formed using a vapor deposition reactor, according to one embodiment.
Figure 22B:
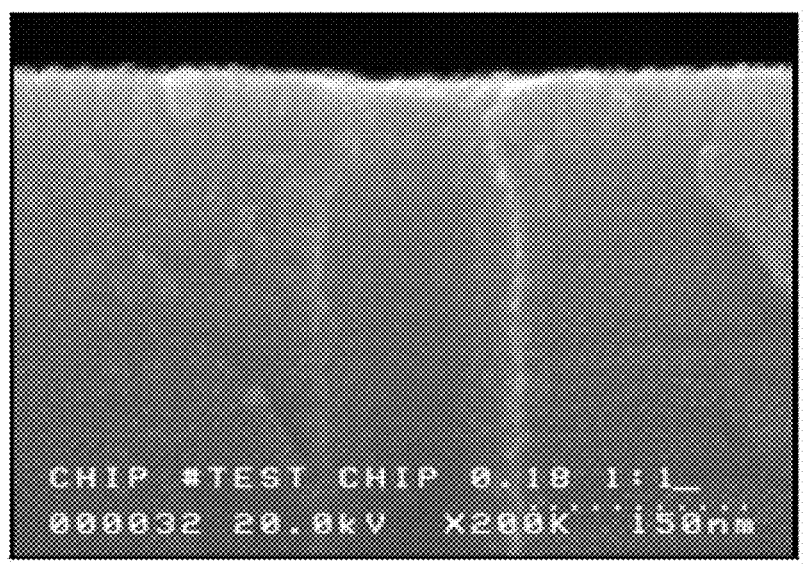
Figure 22C:
Figure 22D:
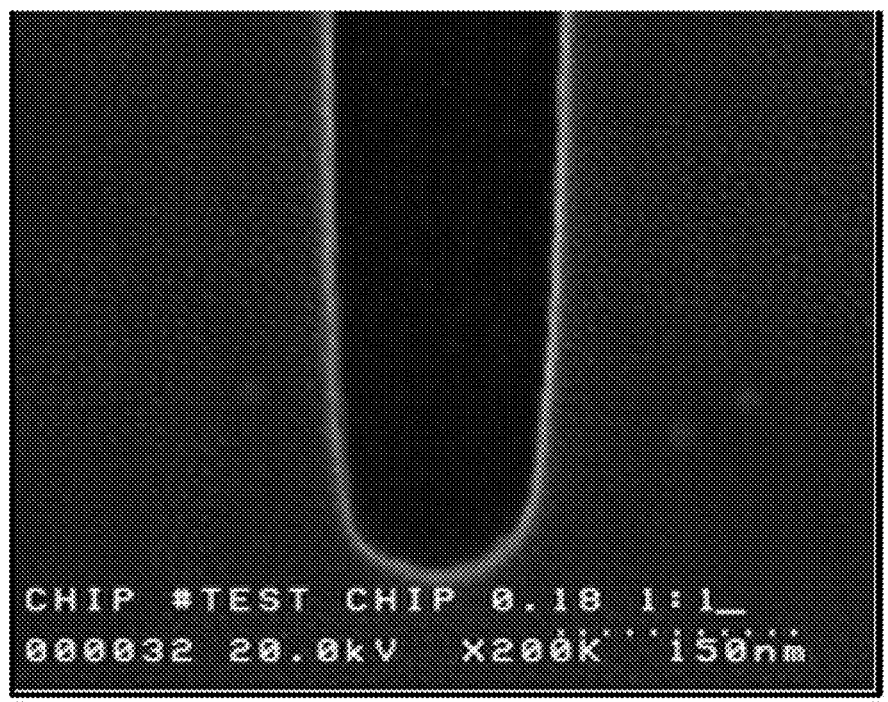

FIG. 22A is a scanning electron microscope (SEM) photograph of a TiN thin film formed using a vapor deposition reactor according to an embodiment. FIGS. 22B to 22D are SEM photographs obtained by enlarging upper, middle and lower portions 2200, 2210, 2220 of FIG. 22A, respectively.

Figure 23A:
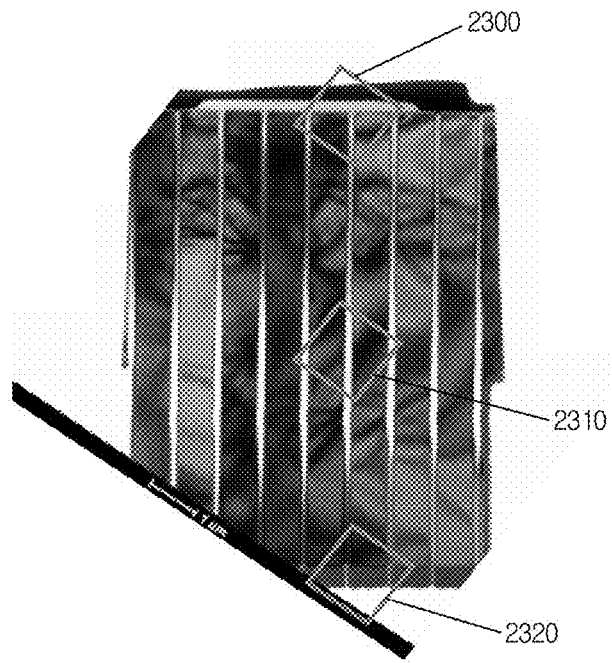
FIGS. 23A to 23D are transmission electron microscope (TEM) photographs of a TiN thin film formed using a vapor deposition reactor, according to one embodiment.
Figure 23B:
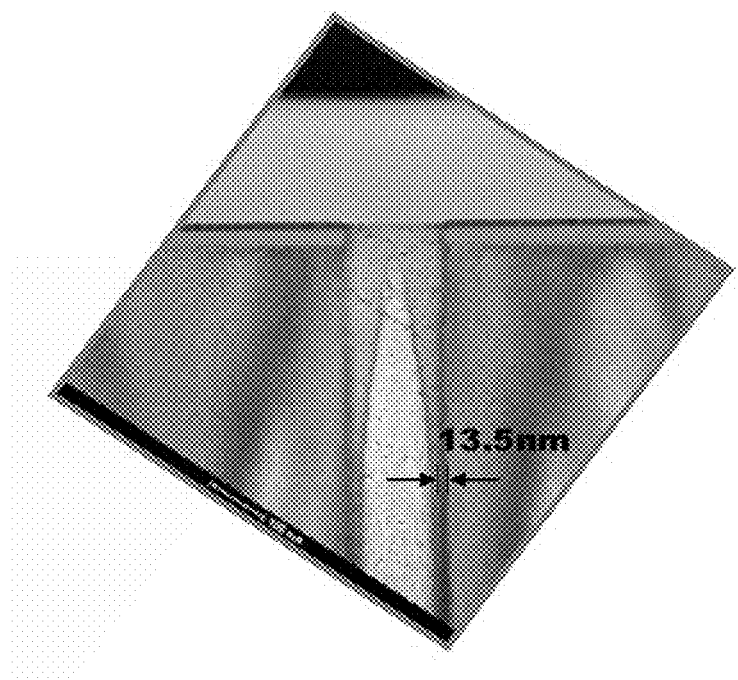
Figure 23C:
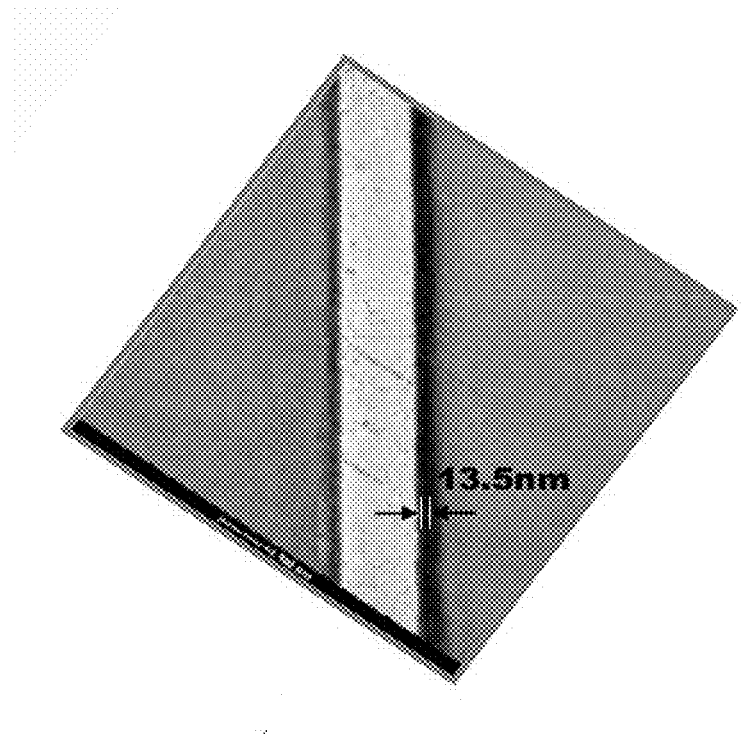
Figure 23D:
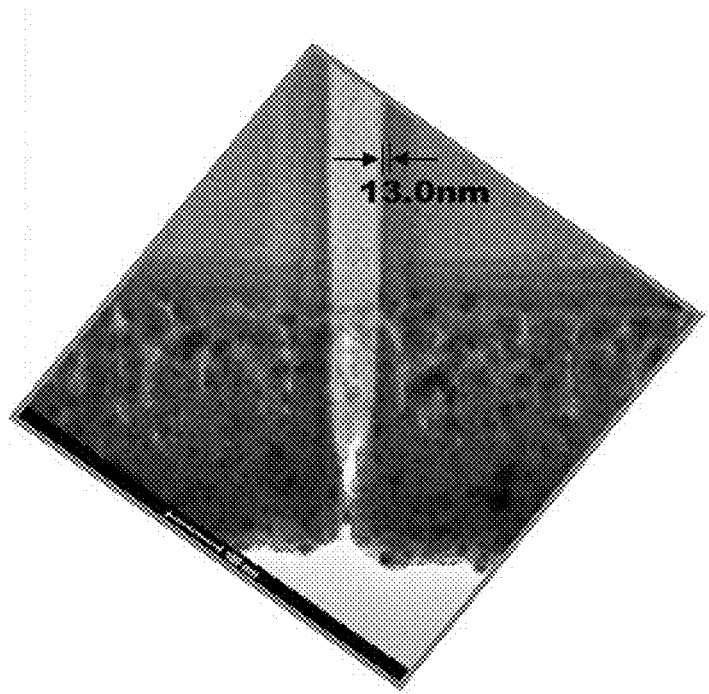

FIG. 23A is a transmission electron microscope (TEM) photograph of the TiN thin film formed using the vapor deposition reactor according to an embodiment. FIGS. 23B to 23D are TEM photographs obtained by enlarging upper, middle and lower portions 2300, 2310, 2320 of FIG. 23A, respectively.

The TiN thin films shown in FIGS. 22 and 23 are deposited on a trench pattern with a diameter of about 135 nm so as to check conformality that is a characteristic of the atomic-layer thin film. At this time, the depth of a trench is about 8 μm, and the pattern density is 1:2. Ar gas of about 3 sccm is used to bubble $TiCl_4$ as a source precursor, and $NH_3$ gas of about 20 sccm is used as a reactant precursor. The deposition temperature of the thin film is about 380° C., and the rotating table is rotated 200 times at a rotation velocity of about 10 rpm, thereby depositing a TiN atomic-layer thin film with a thickness of about 13.5 nm. Whenever the substrate passes by the vapor deposition reactor, a TiN thin film with a thickness of about 0.67 Å is formed. The TiN thin film has the (111) crystal direction with a columnar shape, and has excellent conformality in which a bottom coverage is 95%.

Figure 24A:
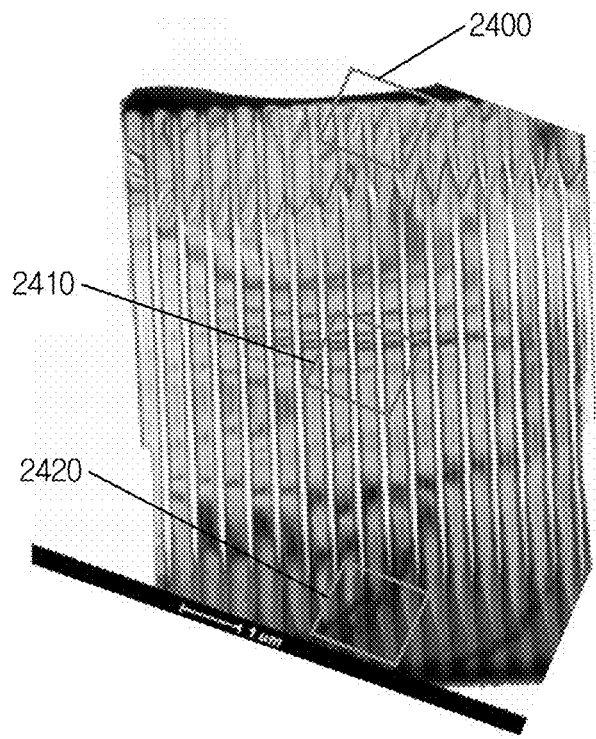
FIGS. 24A to 24D are TEM photographs of a TiN thin film formed using a vapor deposition reactor, according to one embodiment.
Figure 24B:
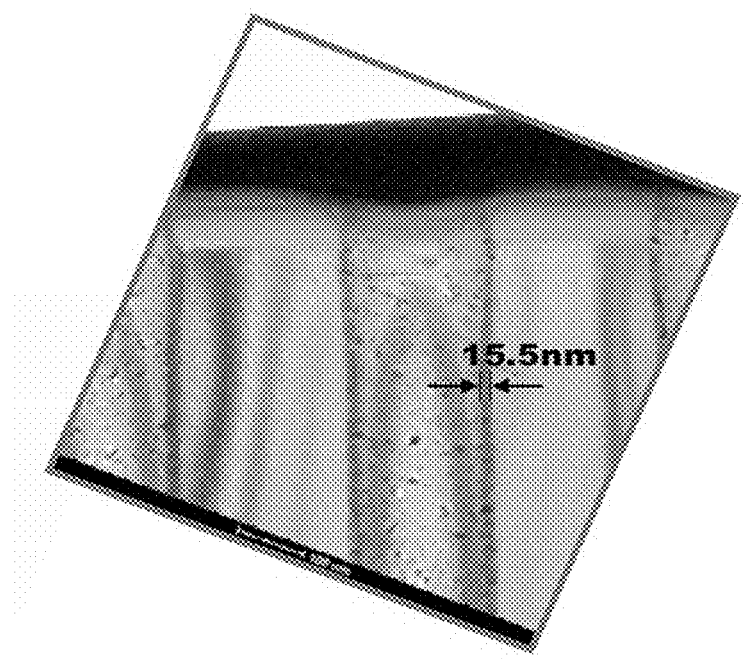
Figure 24C:
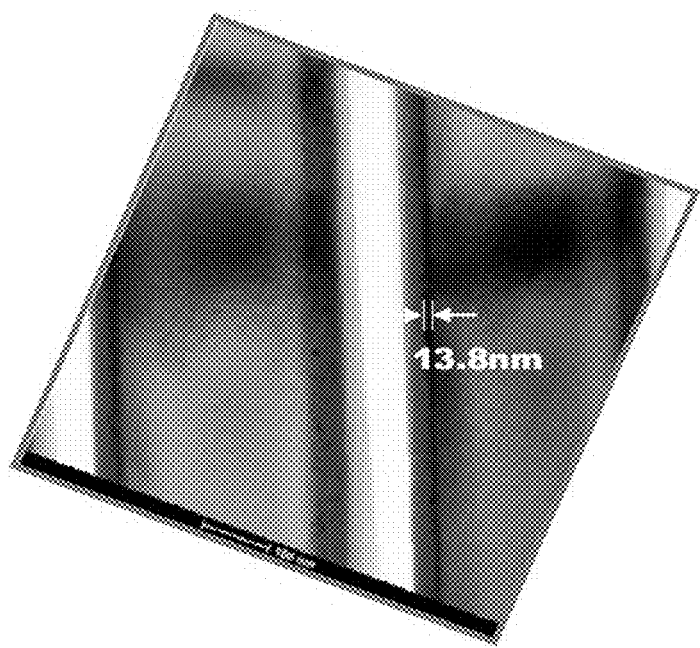
Figure 24D:
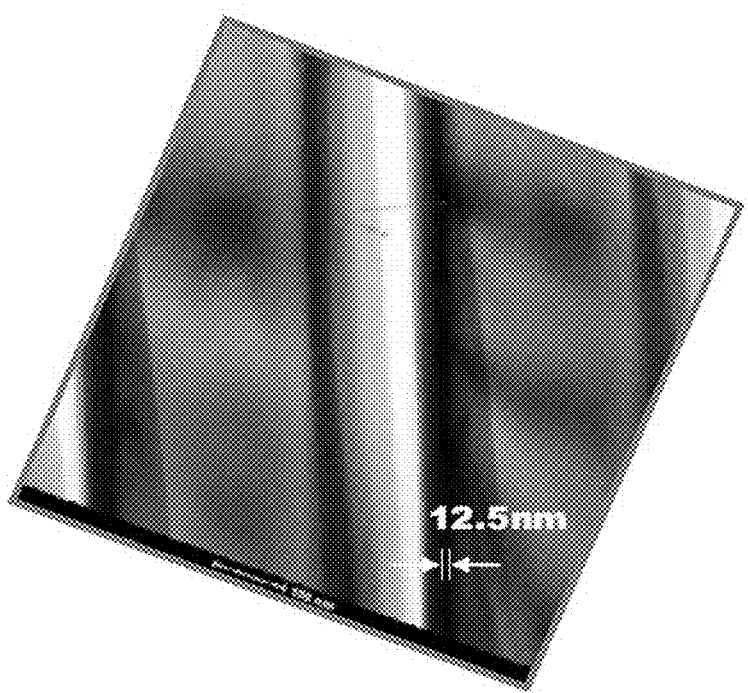

FIG. 24A is an SEM photograph of a TiN thin film formed using a vapor deposition reactor according to another embodiment. FIGS. 24B to 24D are SEM photographs obtained by enlarging upper, middle and lower portions 2400, 2410, 2420 of FIG. 24A, respectively. FIG. 24 illustrates a TiN atomic-layer thin film formed using remote-plasma.

In the TiN thin film shown in FIG. 24, Ar gas of about 3 sccm is used to bubble $TiCl_4$ as a source precursor, and $NH_3$ gas of about 15 sccm is used as a reactant precursor. Power of 10 W is applied for generating plasma. The deposition temperature of the thin film is about 380° C., and the rotating table is rotated 200 times at a rotation velocity of about 10 rpm, thereby depositing a TiN atomic-layer thin film with a thickness of about 15.5 nm. Whenever the substrate passes by the vapor deposition reactor, a TiN thin film with a thickness of about 0.77 Å is formed. The TiN thin film has a step-coverage of 80%.

The TiN thin films shown in FIGS. 22 and 23 are compared with the TiN thin film shown in FIG. 24. When radicals are generated by plasma are used, the deposition velocity is increased, but the conformality is decreased.

In the conventional methods of atomic layer deposition, a precursor is injected into the chamber, and a thin film is obtained using only a molecule layer adsorbed on the surface of the substrate. Therefore, in the formation of an atomic layer, the deposition efficiency, i.e., the ratio of a source used in the deposition with respect to a total source injected, has a close relationship with the size of the chamber.

However, if one of the vapor deposition reactors according to the aforementioned embodiments are used, the reacting material is filled only in the first portion of the vapor deposition reactor, and hence, the deposition efficiency is very higher than that in the conventional vapor deposition reactors. Also, since the adsorption and desorption of the molecule layer are performed while passing the substrate through the lower portion of the vapor deposition reactor, the precursor is continuously supplied with no valve for ALD or driving unit, and thus, the configuration of the vapor deposition reactor can be simplified.

Also, since the injection, desorption and exhaustion of the reacting material are performed in the interior of the vapor deposition reactor, the deposition can be performed regardless of the atmosphere in the interior of the chamber. Also, since the source precursor and reactant precursor are injected into and exhausted from separate vapor deposition reactors, respectively, a reactant byproduct such as powder or gum is not produced in an exhaust line. Accordingly, the reliability, durability and economy of the apparatus can be improved in addition to the thin film.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:
1. A vapor deposition reactor comprising:
   a first portion of a body formed with a first recess for receiving a reaction material, the first portion of the body having a first bottom surface defining the first recess and facing a substrate passing below the vapor deposition reactor, the first recess subject to a first pressure of the reaction material and formed within the first portion at a lower side of the body;
   a second portion of the body adjacent to the first portion of the body, the second portion formed with a second recess communicatively connected to the first recess, the second portion of the body having a second bottom surface defining the second recess and facing the substrate, the second recess subject to a second pressure of the reaction material lower than the first pressure by having a height not greater than ⅔ of a width of the first recess, the height representing a vertical distance between a lowest surface of the body and the second bottom surface; and
   a third portion of the body adjacent to the second portion of the body, the third portion communicatively connected to the second portion of the body to discharge the reac- tion material from the vapor deposition reactor, the second portion bounded at sides by the first and third portions.

2. The vapor deposition reactor according to claim 1, wherein a width of the second portion is greater than a half of a height of the second recess.

3. The vapor deposition reactor according to claim 1, wherein the height of the second recess is not greater than ⅓ of a height of the first recess.

4. The vapor deposition reactor according to claim 1, wherein the width of the third portion is greater than the height of the second recess.

5. The vapor deposition reactor according to claim 1, wherein the third portion is subject to a third pressure lower than the first pressure.

6. The vapor deposition reactor according to claim 1, further comprising a first adjustable wing configured to at least partially change the height of the second recess.

7. The vapor deposition reactor according to claim 1, further comprising a second adjustable wing configured to change the ratio of the height of the second recess with respect to the width of the first recess.

8. The vapor deposition reactor according to claim 1, wherein the reacting material comprises a source precursor and a reactant precursor for performing atomic layer deposition (ALD).

9. The vapor deposition reactor according to claim 8, wherein the source precursor comprises an inorganic compound and an organic compound.

10. The vapor deposition reactor according to claim 8, wherein the reactant precursor comprises one or more selected from the group consisting of $H_2O$, $H_2O_2$, $O_2$, $N_2O$, NO, $O_3$, $O^*$ radical, $NH_3$, $NH_2$—$NH_2$, $N^*$ radical, CO, $CO_2$, $CH_4$, $C_2H_6$, $H_2$ and $H^*$ radical.

11. The vapor deposition reactor according to claim 1, wherein the first injection portion further injects an inert gas into the first recess.

12. The vapor deposition reactor according to claim 11, wherein the inert gas comprises one or more selected from the group consisting of $N_2$, Ar and He.

13. The vapor deposition reactor according to claim 1, further comprising at least one second injection portion connected to the first recess and configured to inject an inert gas to the first recess.

14. The vapor deposition reactor according to claim 13, wherein the inert gas comprises one or more selected from the group consisting of $N_2$, Ar and He.

15. The vapor deposition reactor according to claim 1, wherein the first portion comprises a plurality of first recesses, and the second portion comprises a plurality of second recesses.

16. The vapor deposition reactor according to claim 1, wherein the reaction material is a precursor, inert gas, radical or mixture thereof.

17. The vapor deposition reactor according to claim 1, wherein the height of the second recess is not greater than ⅓ of the width of the first recess.

18. The vapor deposition reactor according to claim 1, wherein a distance between the substrate to the vapor deposition reactor is 0.5 mm to 3 mm.

* * * * *